(12) United States Patent
Ma et al.

(10) Patent No.: US 12,191,296 B2
(45) Date of Patent: Jan. 7, 2025

(54) METHOD OF PRODUCING A MULTI-CHIP ASSEMBLY

(71) Applicant: Infineon Technologies AG, Neubiberg (DE)

(72) Inventors: Ling Ma, Redondo Beach, CA (US); Robert Haase, San Pedro, CA (US); Timothy Henson, Mount Shasta, CA (US)

(73) Assignee: Infineon Technologies AG, Neubiberg (DE)

( * ) Notice: Subject to any disclaimer, the term of this patent is extended or adjusted under 35 U.S.C. 154(b) by 579 days.

(21) Appl. No.: 17/520,924

(22) Filed: Nov. 8, 2021

(65) Prior Publication Data

US 2023/0145931 A1 May 11, 2023

(51) Int. Cl.
*H01L 25/00* (2006.01)
*H01L 21/784* (2006.01)
*H01L 23/00* (2006.01)
*H01L 25/07* (2006.01)

(52) U.S. Cl.
CPC .............. *H01L 25/50* (2013.01); *H01L 24/24* (2013.01); *H01L 24/96* (2013.01); *H01L 25/072* (2013.01); *H01L 21/784* (2013.01); *H01L 2224/24137* (2013.01); *H01L 2224/245* (2013.01); *H01L 2224/95001* (2013.01); *H01L 2224/96* (2013.01); *H01L 2924/10156* (2013.01); *H01L 2924/10161* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| 7,642,175 | B1 | 1/2010 | Patwardhan et al. |
| 10,403,601 | B2 * | 9/2019 | Im .......................... H01L 24/00 |
| 11,037,907 | B2 * | 6/2021 | Im ....................... H01L 23/5385 |
| 2004/0048445 | A1 | 3/2004 | Chason et al. |
| 2007/0216013 | A1 * | 9/2007 | Funakoshi .............. H01L 24/40 257/691 |
| 2010/0190293 | A1 | 7/2010 | Maeda et al. |
| 2011/0159638 | A1 | 6/2011 | Wang |

(Continued)

FOREIGN PATENT DOCUMENTS

WO    WO-2017218968 A2 * 12/2017 ........... H01L 21/565

*Primary Examiner* — Telly D Green
(74) *Attorney, Agent, or Firm* — Murphy, Bilak & Homiller, PLLC

(57) ABSTRACT

A multi-chip assembly includes: a first power transistor die having a source terminal facing a first direction and a drain terminal facing a second direction opposite the first direction; and a second power transistor die having a drain terminal facing the first direction, and a source terminal facing the second direction. A dielectric material occupies a gap between the first power transistor die and the second power transistor die, and secures the first power transistor die and the second power transistor die to one another. A metallization connects the source terminal of the first power transistor die to the drain terminal of the second power transistor die at a same side of the multi-chip assembly. The gap occupied by the dielectric material is less than 70 μm. Corresponding methods of producing multi-chip assemblies are also described.

12 Claims, 26 Drawing Sheets

(56) References Cited

U.S. PATENT DOCUMENTS

| | | |
|---|---|---|
| 2013/0065362 A1 | 3/2013 | Horng |
| 2016/0064308 A1* | 3/2016 | Yamada .................. H01L 25/04 257/697 |
| 2016/0126157 A1* | 5/2016 | Jeon ........................ H01L 25/18 257/693 |
| 2017/0365583 A1* | 12/2017 | Im ......................... H01L 21/565 |
| 2019/0348399 A1* | 11/2019 | Im ........................ H01L 25/0657 |
| 2021/0265318 A1* | 8/2021 | Im ........................ H01L 23/5385 |

\* cited by examiner

METHOD OF PRODUCING A MULTI-CHIP ASSEMBLY

BACKGROUND

In many types of power converter and inverter applications, two power power transistors are electrically connected in a half-bridge configuration with the drain terminal of one power transistor connected to the source terminal of the other power transistor at a switch node. Conventionally, the power power transistors are implemented as two separate dies (chips) connected by metal clips and metal wire bonds at the package level which increases loop inductance. However, higher loop inductance results in additional power losses for the module.

Thus, there is a need for an improved multi-chip power assembly with reduced loop inductance and corresponding method of production.

SUMMARY

According to an embodiment of a method of producing multi-chip assemblies, the method comprises: processing a semiconductor wafer into a plurality of separated dies, the plurality of separated dies including a first group of separated dies and a second group of separated dies; and via wafer-level processing: reversing an orientation of the second group of separated dies such that the second group of separated dies have an opposite orientation as the first group of separated dies; securing the separated dies of the first group and the second group to one another with a dielectric material; electrically interconnecting groups of two or more adjacent ones of the separated dies from the first group and the second group; and removing the dielectric material in a region between the groups of electrically interconnected dies to laterally separate the groups of electrically interconnected dies from one another.

According to another embodiment of a method of producing multi-chip assemblies, the method comprises: processing a semiconductor wafer into a plurality of separated dies, the plurality of separated dies including a first group of separated dies and a second group of separated dies; and via wafer-level processing: replacing the second group of separated dies with a third group of separated dies; securing the separated dies of the first group and the third group to one another with a dielectric material; electrically interconnecting groups of two or more adjacent ones of the separated dies from the first group and the third group; and removing the dielectric material in a region between the groups of electrically interconnected dies to laterally separate the groups of electrically interconnected dies from one another.

According to an embodiment of a multi-chip assembly, the multi-chip assembly comprises: a first power transistor die having a source terminal facing a first direction, and a drain terminal facing a second direction opposite the first direction; a second power transistor die having a drain terminal facing the first direction, and a source terminal facing the second direction; a dielectric material occupying a gap between the first power transistor die and the second power transistor die, and securing the first power transistor die and the second power transistor die to one another; and a metallization connecting the source terminal of the first power transistor die to the drain terminal of the second power transistor die at a same side of the multi-chip assembly, wherein the gap occupied by the dielectric material is less than 70 μm.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Described herein are embodiments of a multi-chip power assembly with reduced loop inductance, and corresponding methods of production. The source terminal of a first power transistor die included in the multi-chip power assembly is connected to the drain terminal of a second power transistor die at the same side of the multi-chip assembly by a metallization formed during wafer-level processing instead of during package-level processing. The source-drain connection implemented at the wafer-level reduces the loop inductance as compared to a more inductive package-level connection.

Described next, with reference to the figures, are exemplary embodiments of the multi-chip power assembly and corresponding methods of production.

Figure 1:
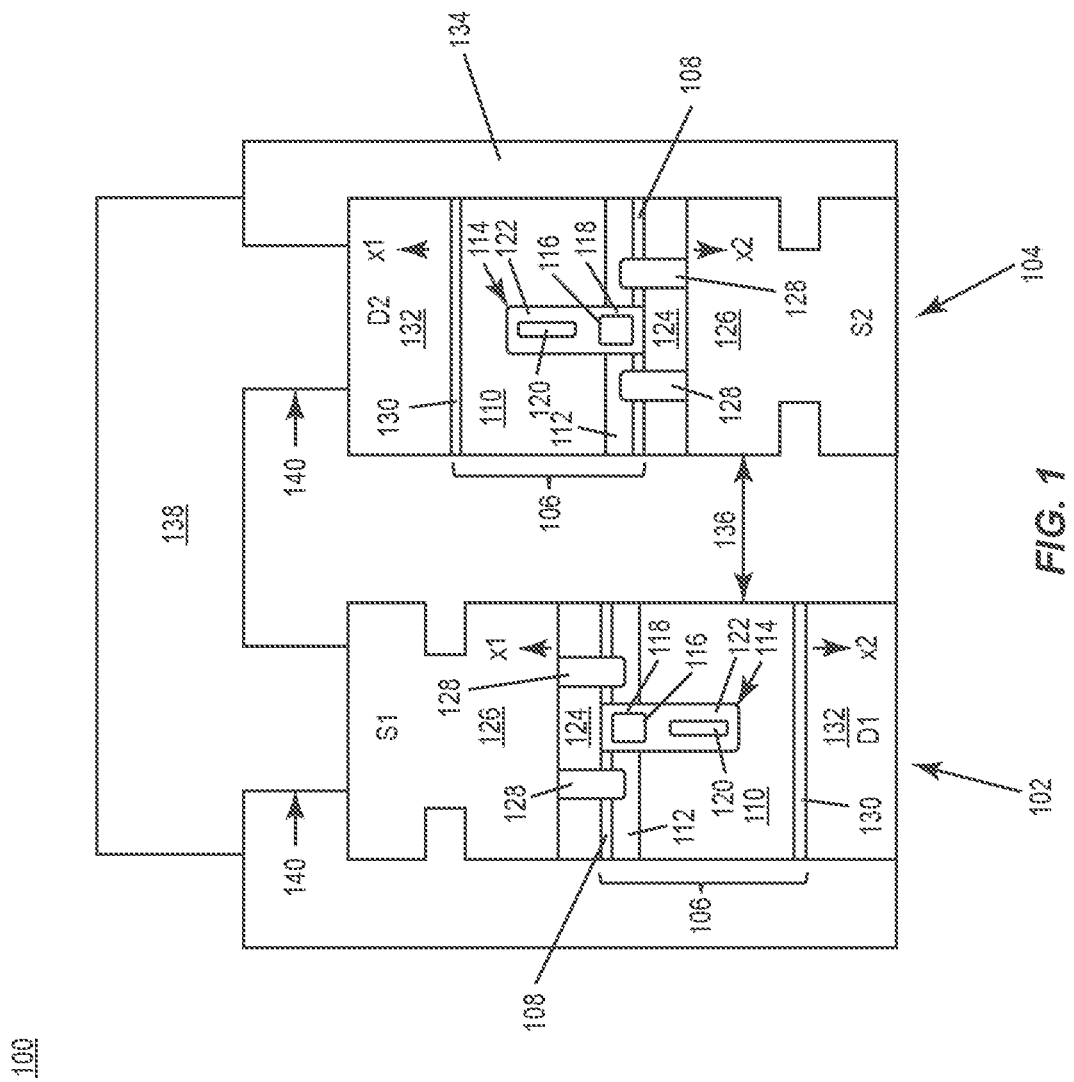
FIG. 1 illustrates a cross-sectional view of an embodiment of a multi-chip assembly.

FIG. 1 illustrates a cross-sectional view of an embodiment of a multi-chip assembly 100 that includes a first die 102 and a second die 104. In one embodiment, the first die 102 and the second die 104 are each a power transistor die such as a power MOSFET (metal-oxide-semiconductor field effect transistor) die, a JFET (junction FET) die, an IGBT (insulated gate bipolar transistor) die, an HEMT (high electron mobility transistor) die, a power diode die, etc. For example, the first die 102 may be an IGBT die and the second die 104 may be a power diode die electrically connected to the IGBT die in an anti-parallel configuration. In another example, both dies 102 may be power transistor dies electrically connected to on another in a half-bridge configuration. In yet another example, the first die 102 may be a power transistor die and the second die 104 may be a gate driver or controller die. Still other examples are contemplated, and more than two dies 102, 104 may be included in the multi-chip assembly 100.

In FIG. 1, the first die 102 and the second die 102 are both shown as identical power MOSFETs but with different orientations. However, the dies 102, 104 may have different shapes and/or different sizes and/or different construction. As shown in FIG. 1, the first die 102 may have a source terminal S1 facing a first direction x1 and a drain terminal D1 facing a second direction x2 opposite the first direction x1. The second die 104 may have a drain terminal D2 facing the first direction x1 and a source terminal S2 facing the second direction x2. The gate terminal of each die 102, 104 is out of view in FIG. 1.

In the case of power transistor dies as the dies 102, 104 included in the multi-chip assembly 100, each die 102, 104 may include 10s, 100s, 1000s or more transistor cells formed in a semiconductor substrate 106 and electrically coupled in parallel to form a power transistor, where each transistor cell has the same or similar construction. Only one transistor cell is shown in FIG. 1 for each die 102, 104, to emphasize other features. The semiconductor substrate 106 may comprise any type of semiconductor material such as SiC, Si, GaN, etc. The semiconductor substrate 106 may include a base semiconductor and one or more epitaxial layers grown on the base semiconductor.

Each transistor cell included in the semiconductor substrate 106 of each die 102, 104 may have a source region 108 of a first conductivity type, a drift zone 110 of the first conductivity type, a body region 112 of a second conductivity type separating the source region 108 from the drift zone 110, and a trench 114. The trench 114 extends into the drift zone 110 and includes a gate electrode 116 insulated from the semiconductor substrate 106 by a gate dielectric 118. The trench 114 may also include a field plate 120 insulated from the drift zone 110 by a field dielectric 122. The field plates 120 may be formed in a different trench than the gate electrodes 116 and/or the gate electrodes 116 may be planar gate electrodes instead of trench gate electrodes.

The trenches 114 with the field plates 120 may be needle-shape or stripe-shaped. The term 'needle-shaped' as used herein means a trench structure that is narrow and long in a depth-wise direction (x1/x2 direction in FIG. 1) of the semiconductor substrate 106. For example, the trenches 114 with the field plates 120 may resemble needles, columns or spicules in the depth-wise (x1/x2) direction of the semiconductor substrate 106. For stripe-shaped trenches, the lengthwise extension runs into and out of the page in FIG. 1.

Some or all field plates 120 may be coupled to a different potential than the gate electrodes 116. For example, the field plates 120 may be grounded. The use of grounded field plates 120 enables a two-dimensional depletion region while shielding the gate dielectric 118 from the drain potential. The field plates 120 are accessible by contacts (out of view) that extend through an interlayer dielectric 124 and to or into the field plates 120, electrically connecting the field plates 120 to a source metallization 126. Additional contacts 128 extend through the source regions 108 and into the body regions 112, electrically connecting both the source regions 108 and the body regions 112 to the source metallization 126. Highly doped body contact regions (not shown) may be formed in the body regions 112 to provide an ohmic connection between the body regions 112 and the corresponding contacts 128.

In the case of a power MOSFET, a drain region 130 of the first conductivity type is disposed at the opposite side of the semiconductor substrate 106 as the source regions 108. The drain region contacts a drain metallization 132 at the opposite side of the device as the source metallization 126. For an IGBT, the source regions 108 are replaced by emitter regions of the first conductivity type and the drain region 130 is replaced by a collector region of the second conductivity type.

As shown in FIG. 1, both dies 102, 104 may be vertical devices in that the main current flow path from the source regions 108 to the drain region 130 is a vertical path along the channels that form in the body regions 112 and through the drift zones 110 to the drain region 130. Depending on the type of device, additional structures may be formed in the drift zones 110 and/or between the drift zones 110 and the drain region 130. For example, a field stop layer (not shown) may be formed between the drift zones 110 and the drain region 130 in the case of an IGBT type device.

In the case of an n-channel device, the source regions 108, drift zones 110 and drain region 130 are doped n-type and the body regions 112 are doped p-type. Conversely in the case of a p-channel device, the source regions 108, drift zones 110 and drain region 130 are doped p-type and the body regions 112 are doped n-type.

In FIG. 1, the orientation of the second die 104 is opposite that of the first die 102. Accordingly, the drain terminal D2 of the second die 104 faces the same direction (x1) as the source terminal S1 of the first die 102 and the source terminal S2 of the second die 104 faces the same direction (x2) as the drain terminal D1 of the first die 102. A dielectric material 134 different than a mold compound occupies a (lateral) gap 136 between the first die 102 and the second die 104. The dielectric material 134 may be photo-sensitive or non-photo-sensitive with photolithographic steps applied. The dielectric material 134 secures the first die 102 and the second die 104 to one another. A mold compound is not used as the dielectric material 134, since the dielectric material 134 is produced during wafer-level processing and not post wafer-level processing. In one embodiment, the dielectric material 134 is an imide, an epoxy or BCB (benzocyclobutene).

Since the dielectric material 134 is produced during wafer-level processing, the gap 136 occupied by the dielectric material 134 may be less than 70 μm. Due to post wafer-level process variation, such a small gap 136 cannot be achieved using standard assembly processes. In one embodiment, the gap 136 occupied by the dielectric material 134 is in a range of 5 μm to Further as part of the wafer-level processing, a metallization 138 is formed that connects the source terminal S1 of the first die 102 to the drain terminal D2 of the second die 104 at the same side of the multi-chip assembly 100. The metallization 138 may comprise a metal or metal alloy. Openings 140 are formed in the dielectric material 134 to expose the source terminal S1 of the first die 102 to the drain terminal D2 of the second die 104 at the same side of the multi-chip assembly 100, or more generally any type of die terminals at this side of the multi-chip assembly 100. The metallization 138 may be deposited in the openings 140 and at least partly cover the dielectric material 134, to connect the source terminal S1 of the first die 102 to the drain terminal D2 of the second die 104 at the same side of the multi-chip assembly 100.

Figure 2:
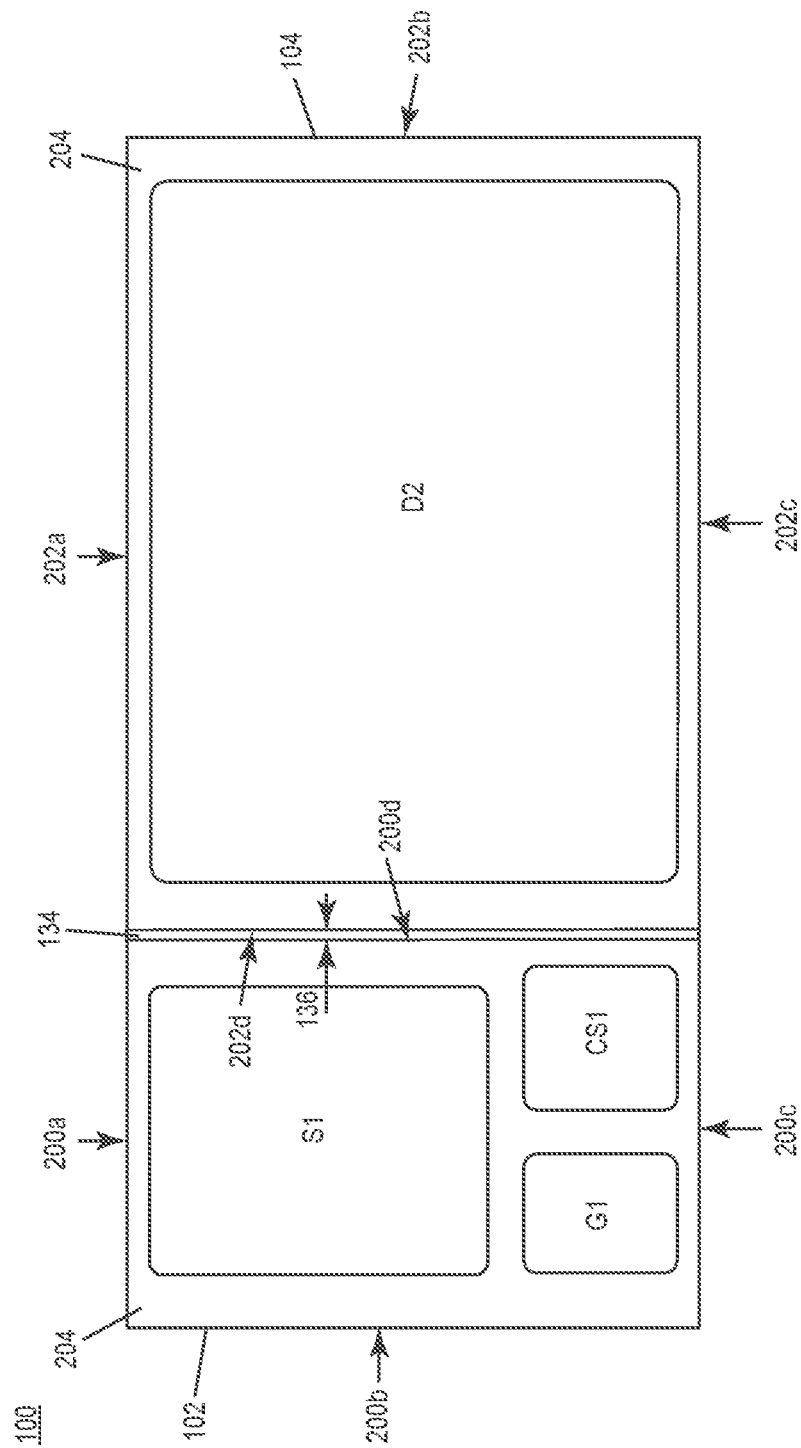
FIG. 2 illustrates a plan view of a multi-chip assembly prior to final metallization, according to an embodiment.

FIG. 2 is a top plan view of the multi-chip assembly 100 prior to formation of the metallization 138 that connects the source terminal S1 of the first die 102 to the drain terminal D2 of the second die 104. According to this embodiment, the first die 102 has a polygon shape with four straight line segments 200a through 200b and the second die 104 also has a polygon shape with four straight line segments 202a through 202b. The first and second dies 102, 104 are disposed next to one another along a respective straight line segment 200d, 202d, with the dielectric material 134 filling the gap 136 between the dies 102, 104. In the case of power transistors, the first die 102 may include a gate terminal G1 at the same side of the die as the source terminal S1. The first die 102 may include one or more additional terminals at the same side of the die as the source and gate terminals S1, G1, e.g., such as a current sense terminal CS1. The side of the second die 104 with the source terminal S2, which is out of view in FIG. 2, may the same or similar terminal configuration as the first die 102. Both dies 102, 104 may also have a final passivation 204 such as polyimide.

Figure 3:
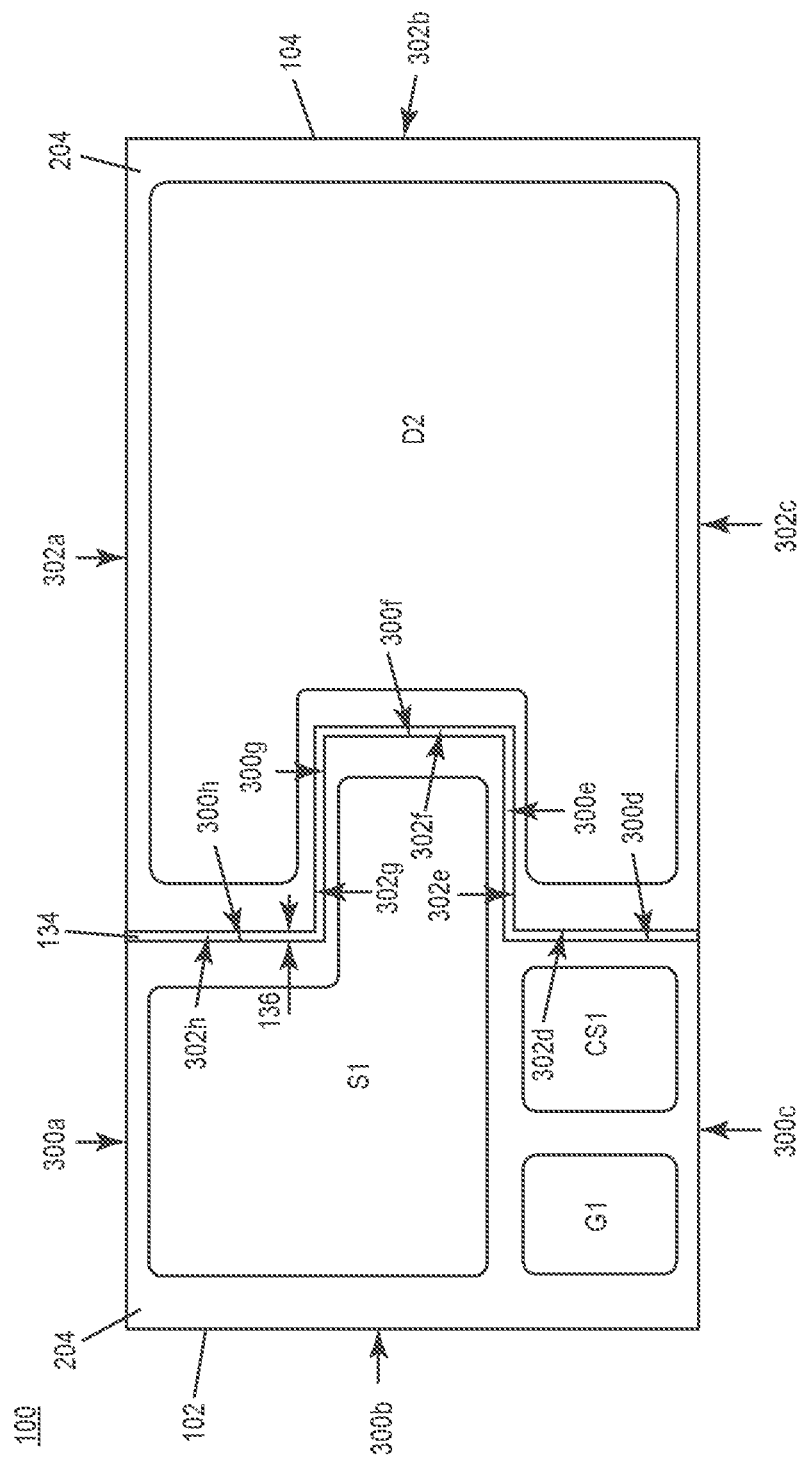
FIG. 3 illustrates a plan view of a multi-chip assembly prior to final metallization, according to another embodiment.

FIG. 3 is a top plan view of another embodiment of the multi-chip assembly 100 prior to formation of the metallization 138 that connects the source terminal S1 of the first die 102 to the drain terminal D2 of the second die 104. According to this embodiment, the first die 102 has a simple polygon shape with more than four straight line segments 300a through 300h and the second die 104 also has a simple polygon shape with more than four straight line segments 302a through 302h. The first and second dies 102, 104 are disposed next to one another along multiple respective straight line segments 300d through 300h, 302d through 302h, with the dielectric material 134 filling the gap 136 between the dies 102, 104. Such a configuration increases the bonding area between the dies 102, 104. One or both of the dies 102, 104 may be plasma or laser etched during the die separation process to yield any desired irregular shape. For example, a deep trench can be teched down to 20 to 30 um, e.g., and the substrate 106 may be thinned by grinding down to 20 um or thinner. The drain metallization 132 is deposited after the thinning.

Figure 4:
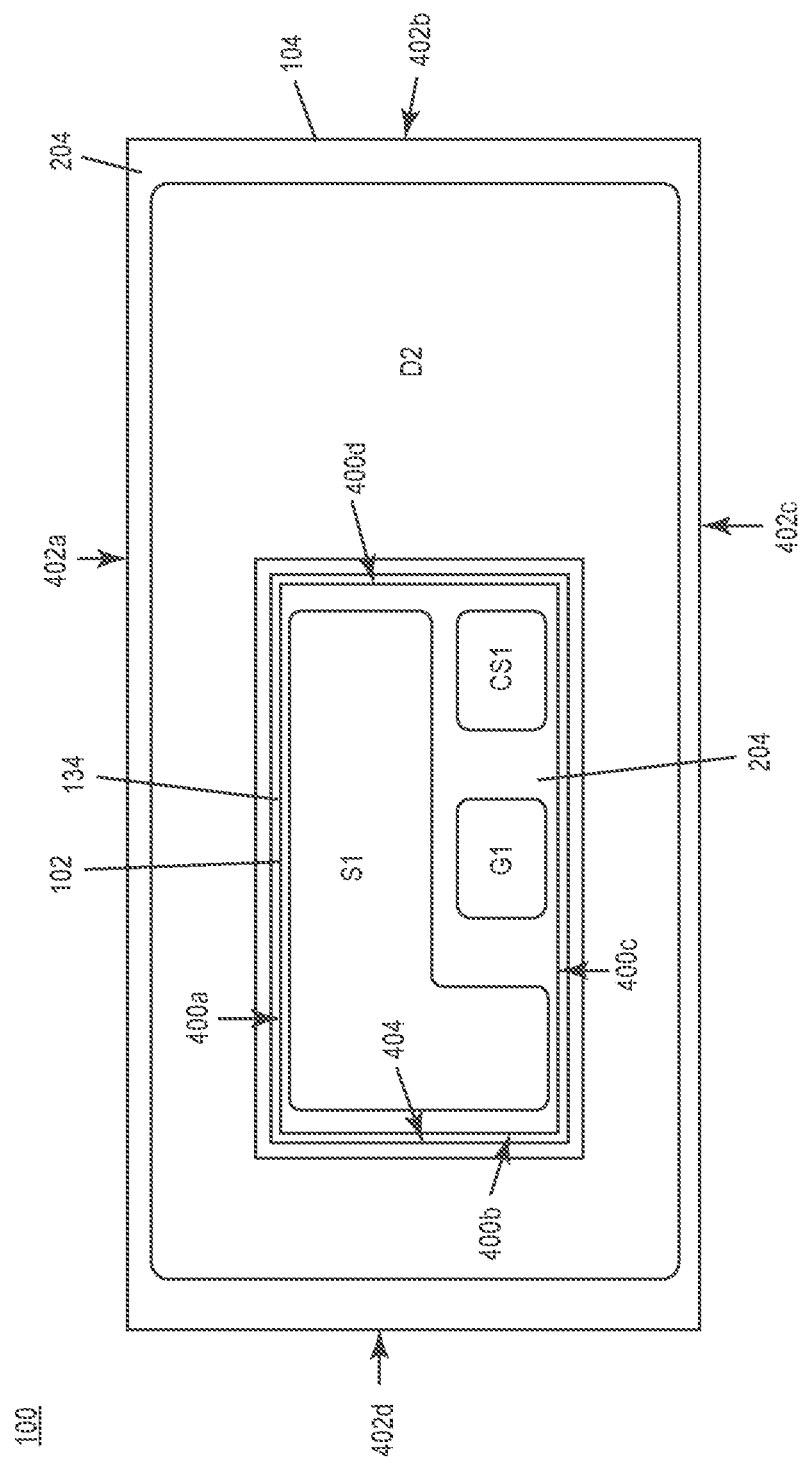
FIG. 4 illustrates a plan view of a multi-chip assembly prior to final metallization, according to another embodiment.

FIG. 4 is a top plan view of another embodiment of the multi-chip assembly 100 prior to formation of the metallization 138 that connects the source terminal S1 of the first die 102 to the drain terminal D2 of the second die 104. According to this embodiment, the first die 102 has a simple polygon shape with four straight line segments 400a through 400d and the second die 104 has a polygon shape with four straight line segments 402a through 402d and a hole 404. The first die 102 is disposed in the hole 406 in the second die 104. The hole 406 may be formed by plasma or laser etching during the die separation process, for example.

Described next are embodiments of a method of producing multi-chip assemblies, e.g., of the kind illustrated in FIGS. 1 through 4.

Figure 5A:
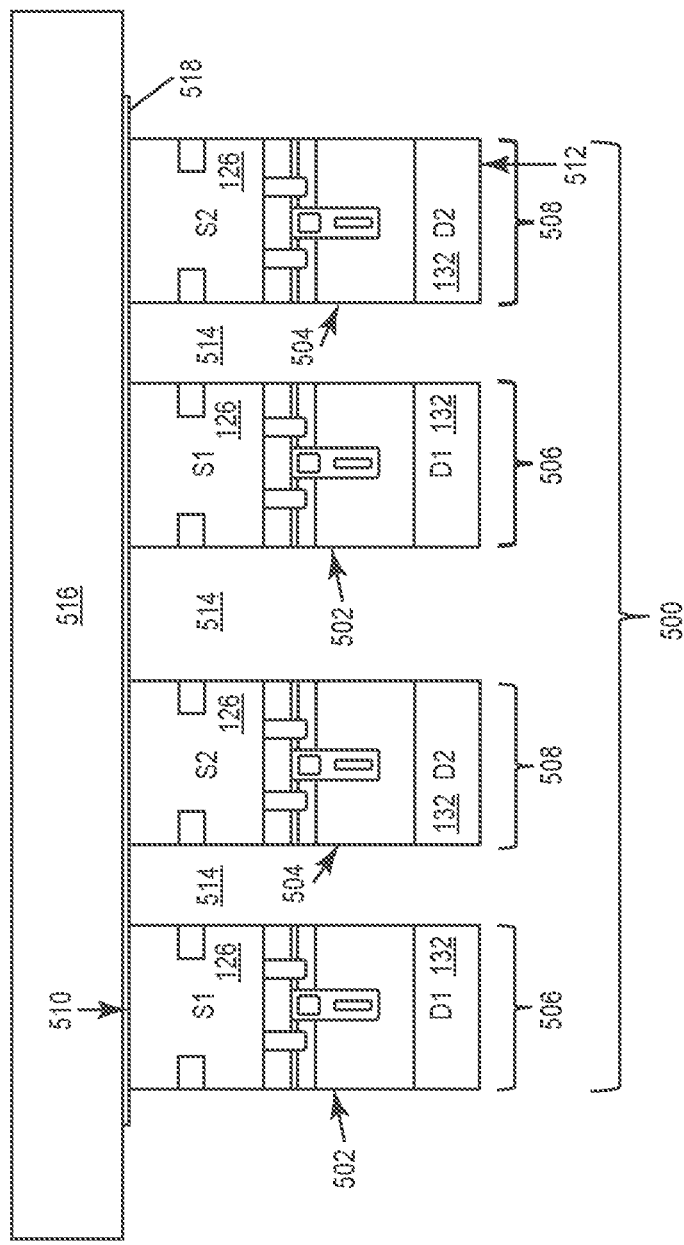
FIGS. 5A through 5N illustrate an embodiment of a method of producing multi-chip assemblies where the orientation of one group of dies is flipped relative to another group of dies.
Figure 5B:
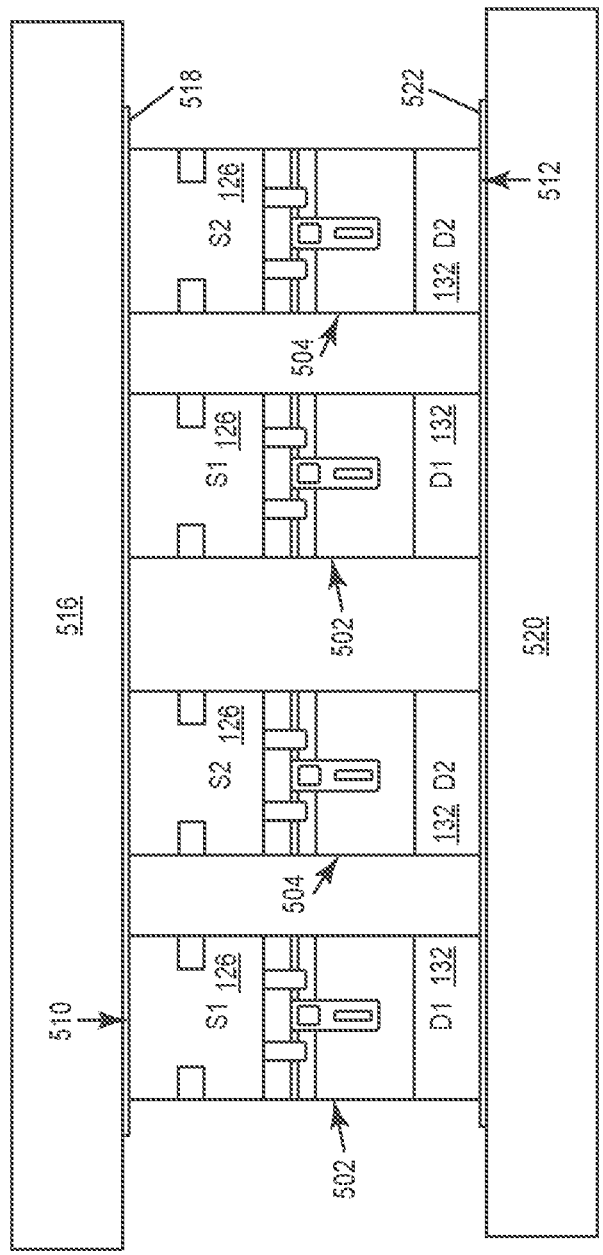
Figure 5C:
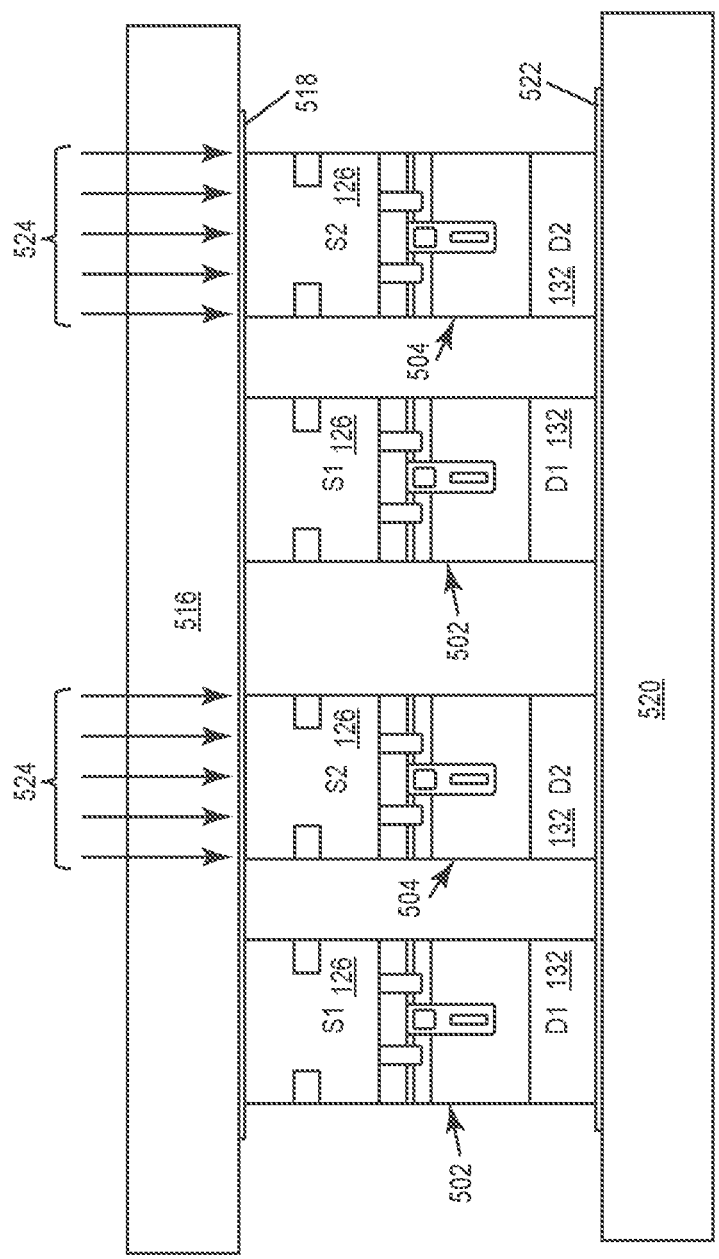
Figure 5D:
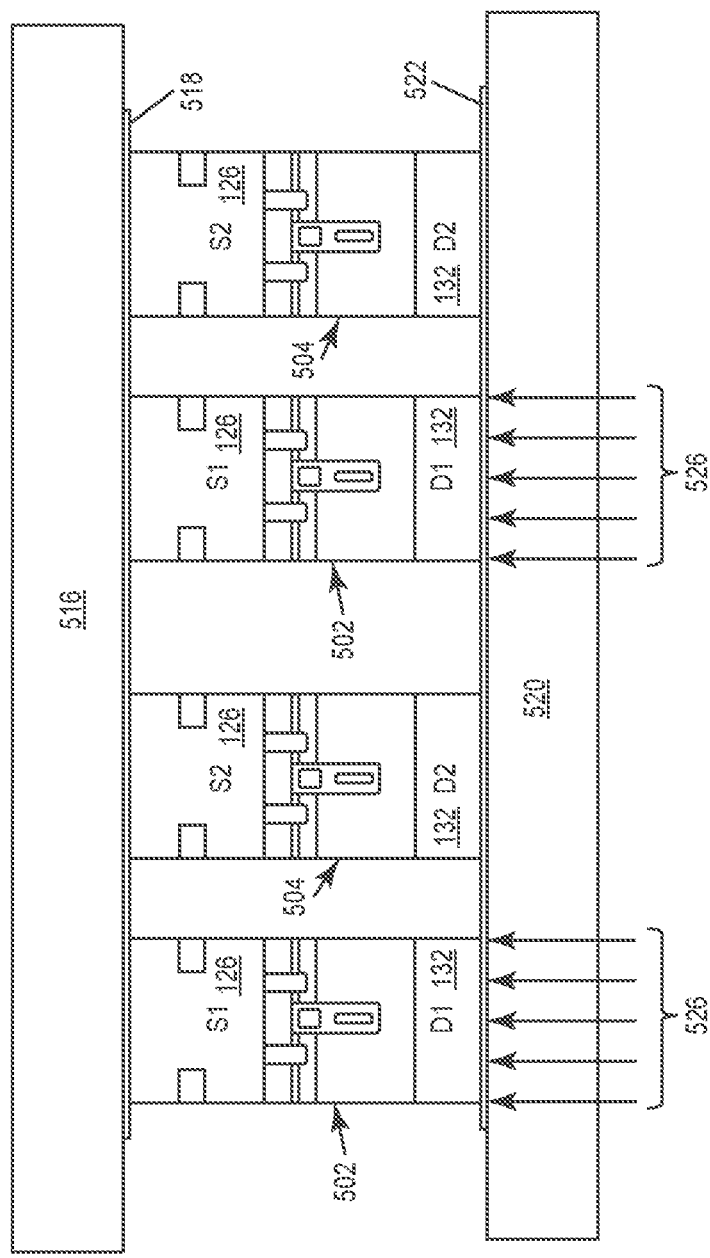
Figure 5E:
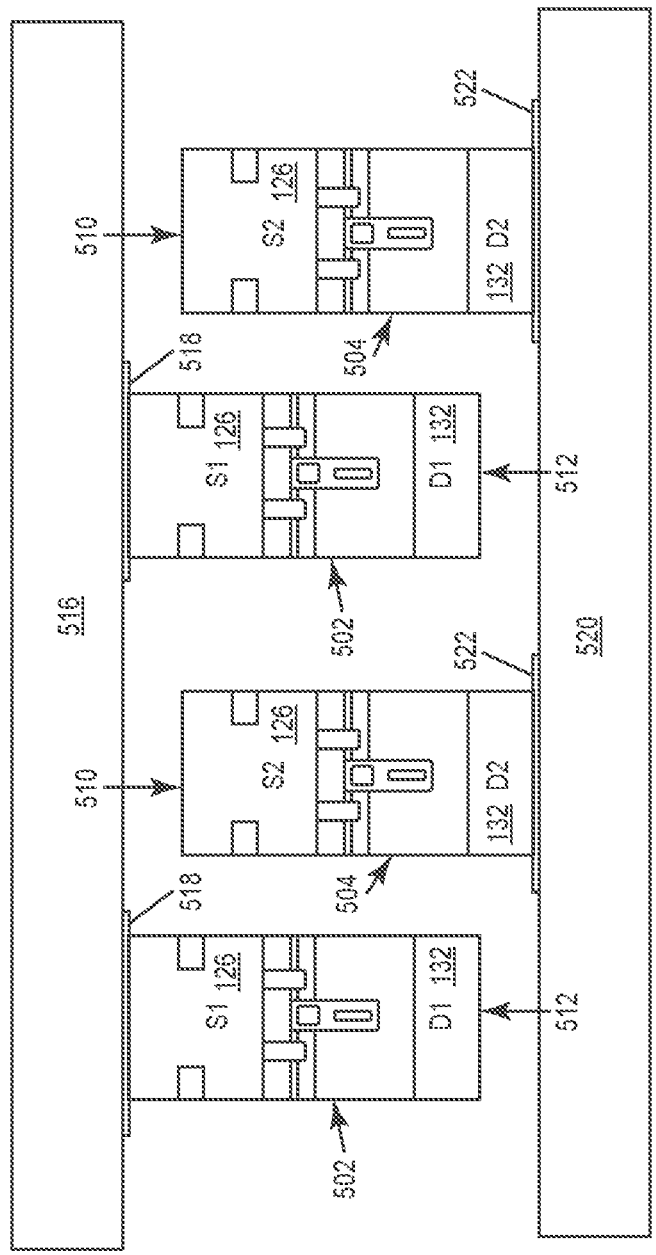
Figure 5F:
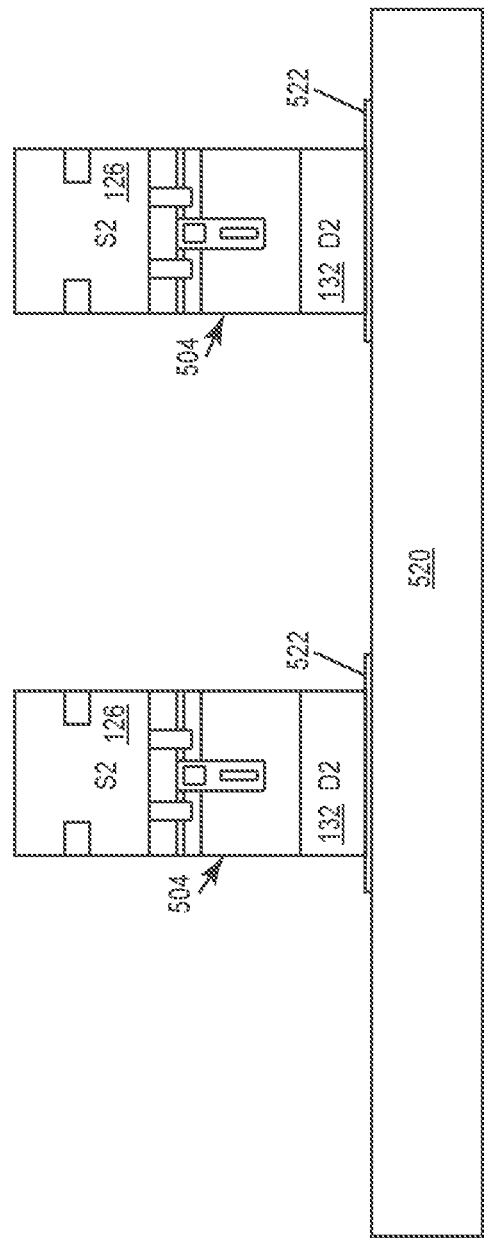
Figure 5G:
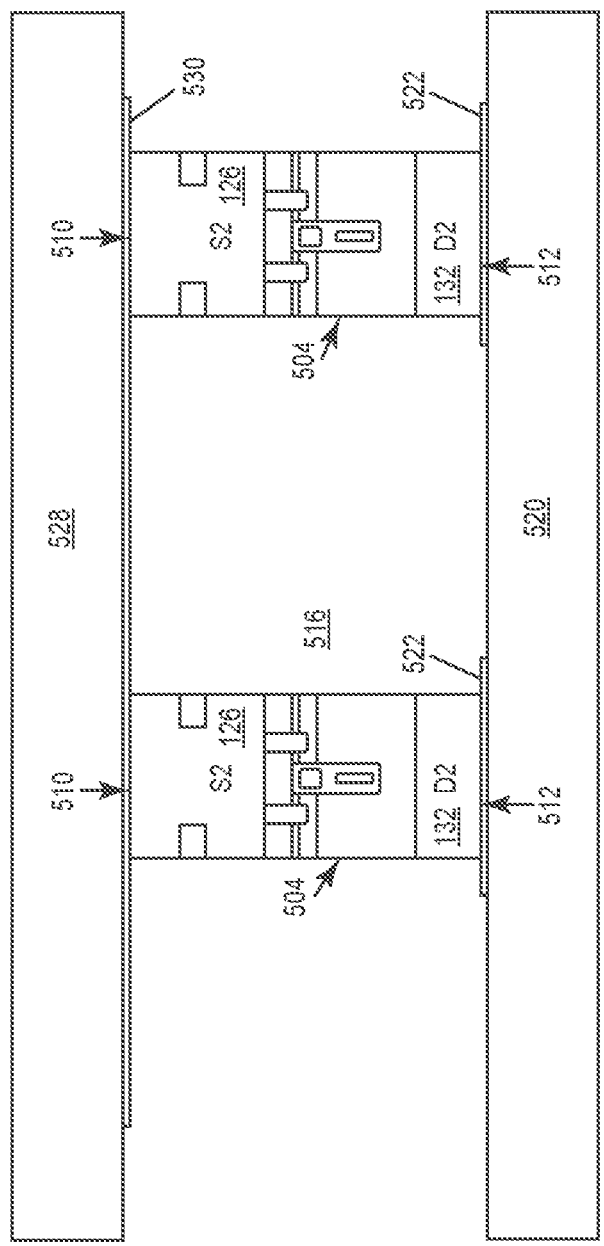
Figure 5H:
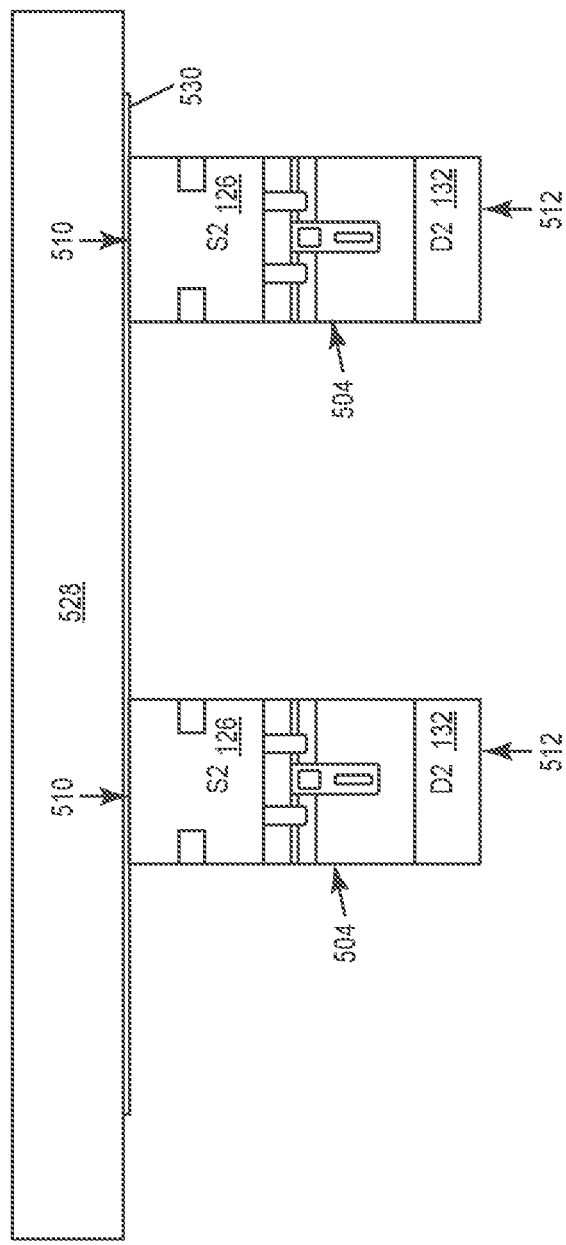
Figure 5I:
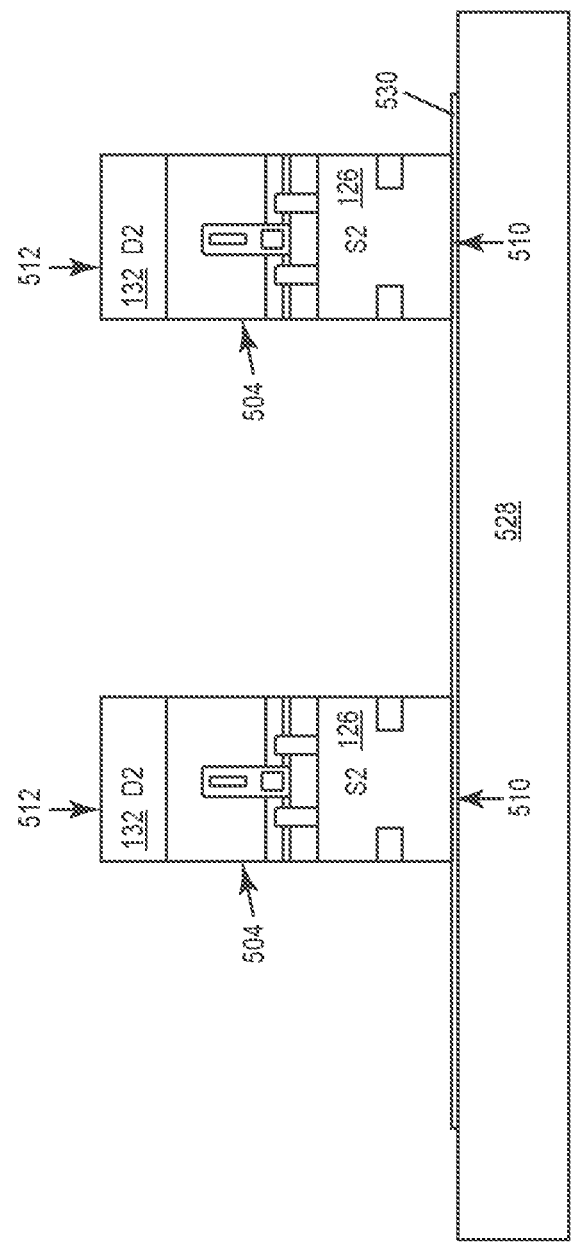
Figure 5J:
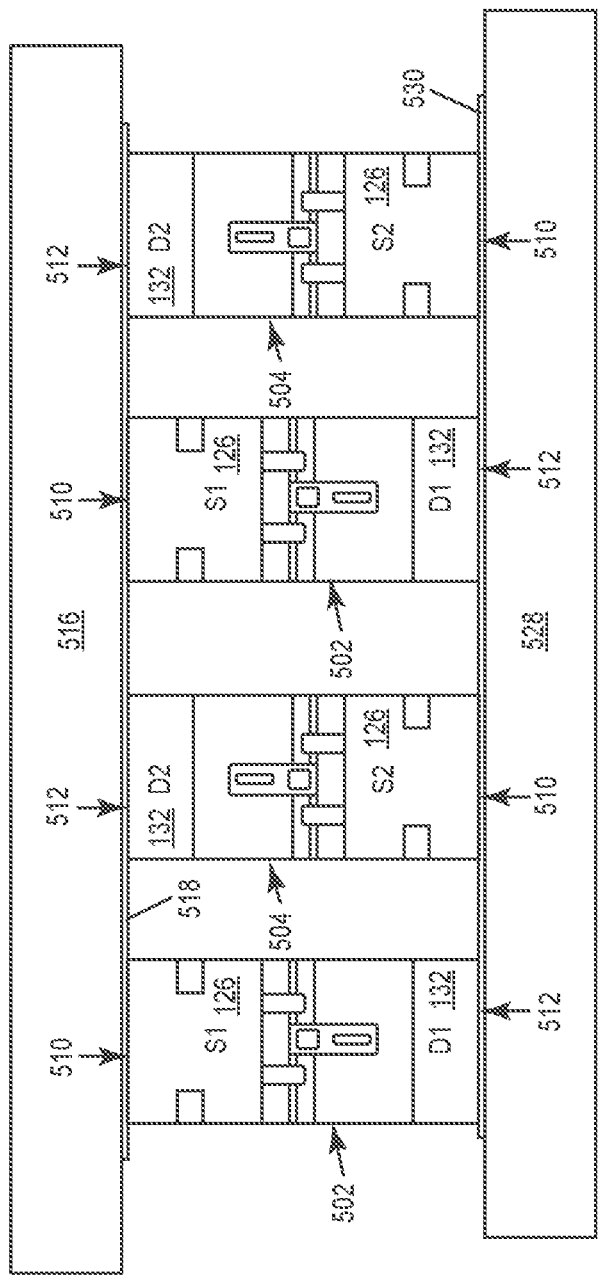
Figure 5K:
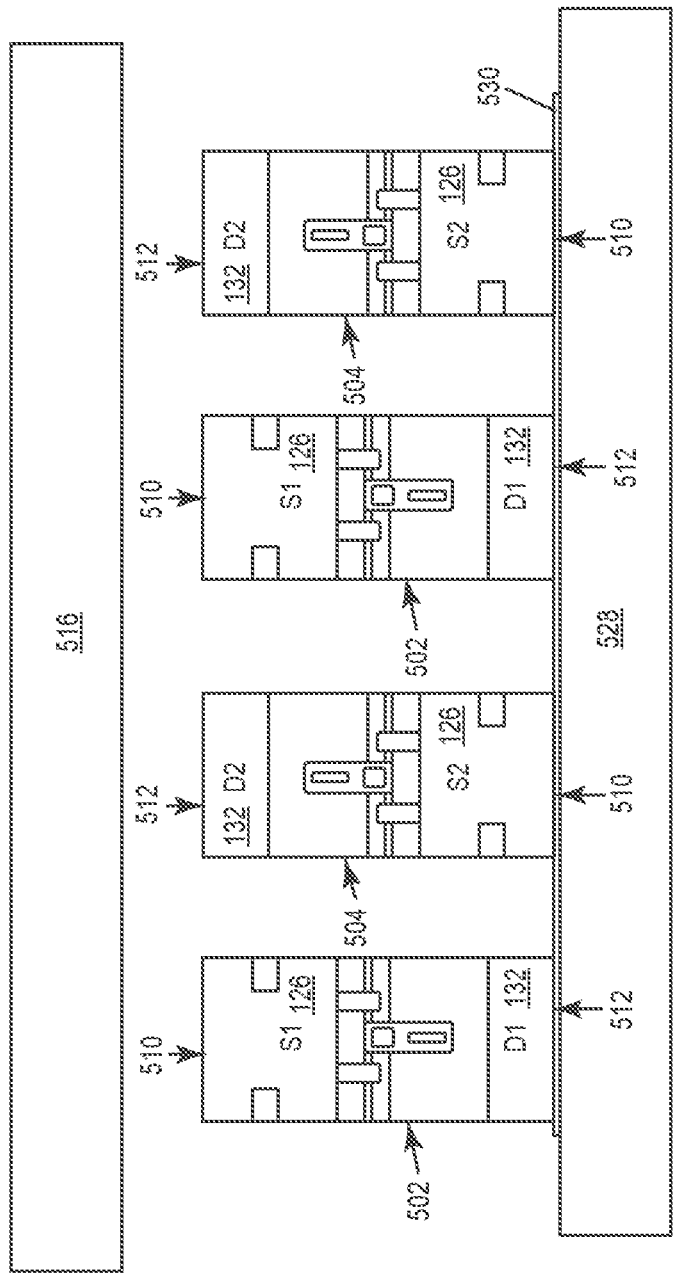
Figure 5L:
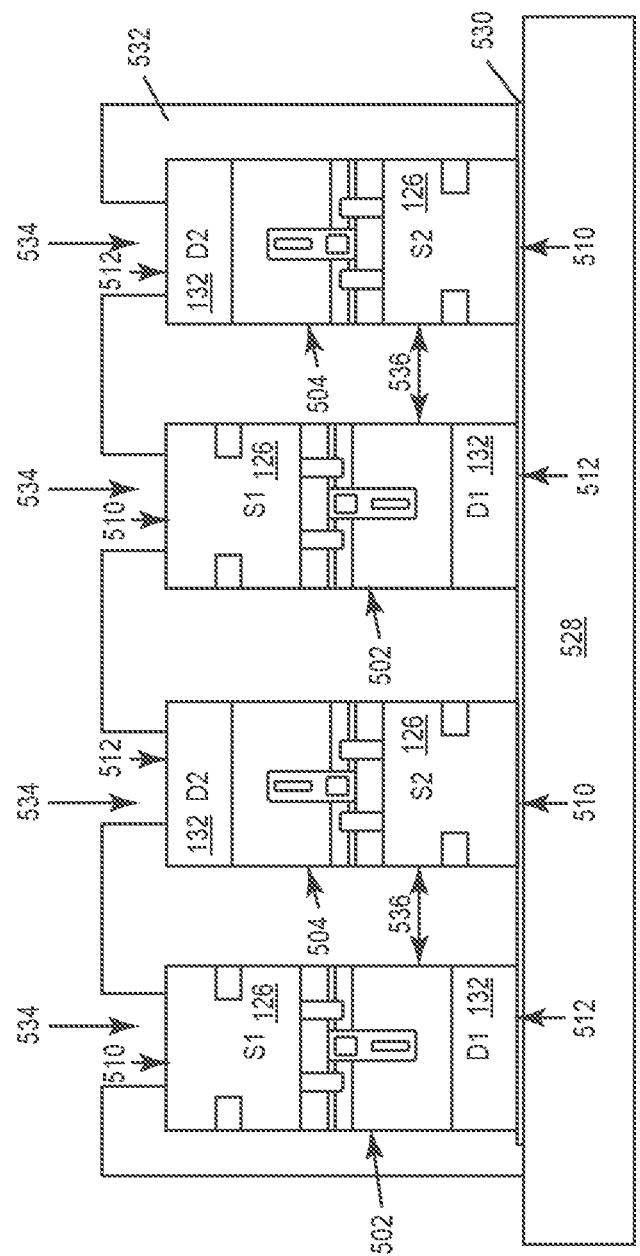
Figure 5M:
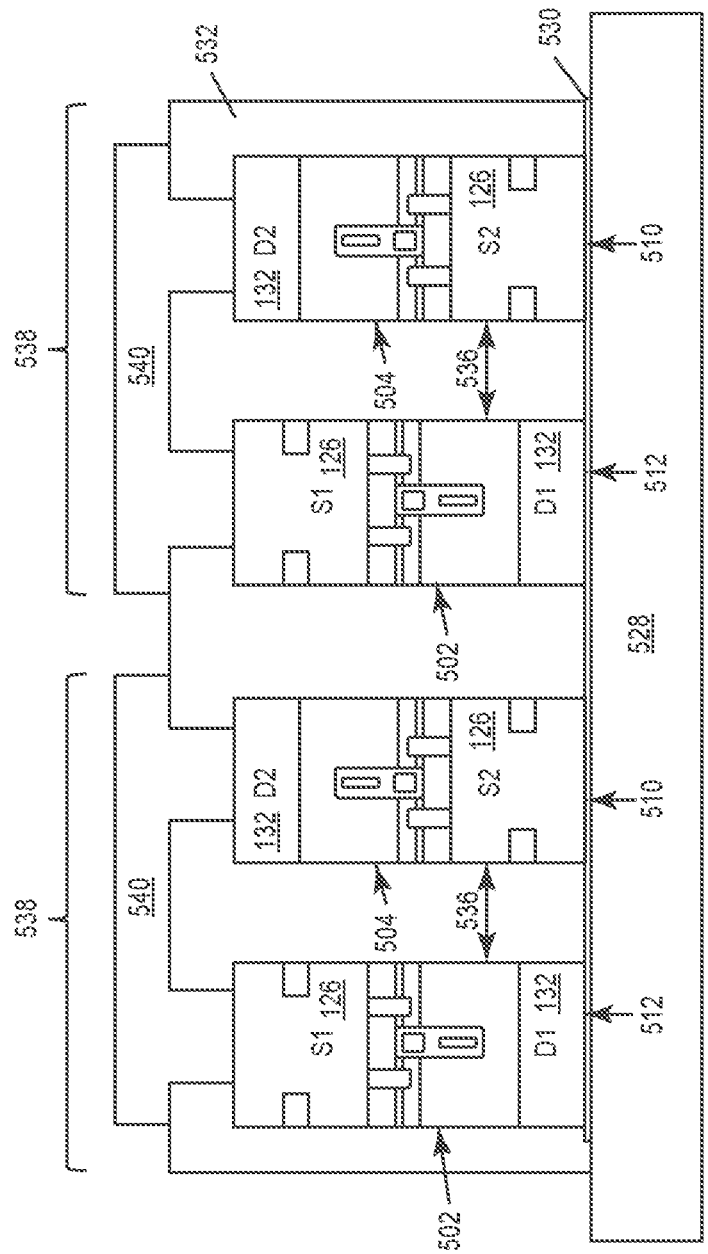
Figure 5N:
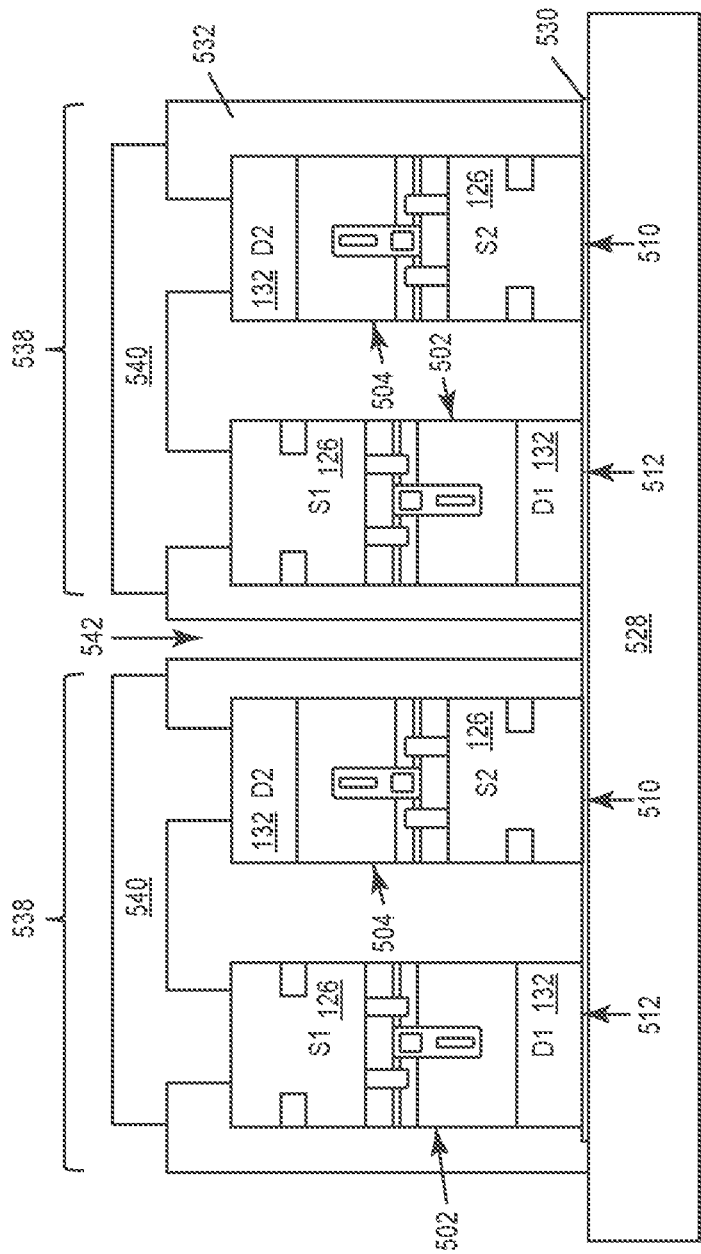

FIGS. 5A through 5N illustrate an embodiment of a method of producing multi-chip assemblies where the orientation of one group of dies is flipped relative to another group of dies, e.g., to enable source-drain connections at the same side in the case of half-bride multi-chip assemblies.

FIG. 5A shows processing of a semiconductor wafer 500 into separated dies 502, 504. The separated dies 502, 504 include a first group 506 of separated dies 502 and a second group 508 of separated dies 504. The first group 506 of separated dies 502 may correspond to the first dies 102 shown in FIGS. 1 through 4, and the second group 508 of separated dies 504 may correspond to the second dies 104 shown in FIGS. 1 through 4. That is, the separated dies 502, 504 may be power transistor dies and each multi-chip assembly to be produced may include one power transistor die 502 from the first group 506 and one power transistor die 504 from the second group 508.

Accordingly, each die 502, 504 may have a source terminal S1/S2 at a frontside 510 of the semiconductor wafer 500 and a drain terminal D1/D2 at a backside 512 of the semiconductor wafer 500. The power transistor dies 502 of the first group 506 and the power transistor dies 504 of the second group 508 may have the same or different transistor cell configuration and the power transistor dies 504 of the second group 508 may have a different shape and/or a different size than the power transistor dies 502 of the first group 506. For example, the power transistor dies 502 of the first group 506 and the power transistor dies 504 of the second group 508 may have any of the shapes shown in FIGS. 2 through 4, or yet different shapes.

In one embodiment, the semiconductor wafer 500 is processed into the separated dies 502, 504 by laser or plasma etching kerf trenches 514 into the frontside 510 of the semiconductor wafer 500. The kerf trenches 514 may be etched to yield the desired shape for the power transistor dies 502 of the first group 506 and the power transistor dies 504 of the second group 508. The kerf trenches 514 may be filled with a dielectric material (not shown). A first carrier 516 may be attached, via a first adhesive 518, to the frontside 510 of each die 502, 504 to provide mechanical stability during subsequent wafer thinning and metal deposition processes. The first carrier 516 may be a glass carrier or another semiconductor wafer, for example. The semiconductor wafer 500 then may be thinned at the backside 512 of the wafer 500, e.g., by grinding, and a metallization layer 132 may be deposited on the thinned backside 512 of the semiconductor wafer 500, e.g., to form the drain D1/D2 terminal of the dies 502, 504.

FIGS. 5B through 5K show reversing, via wafer-level processing, an orientation of the second group 508 of separated dies 504 such that the second group 508 of separated dies 504 have an opposite orientation as the first group 506 of separated dies 502. In the case of power transistors, the drain terminal D2 of the second group 508 of separated dies 504 faces the same direction as the source terminal S1 of the first group 506 of separated dies 502.

FIG. 5B shows a second carrier 520 attached, via a second adhesive 522, to the backside side 512 of each separated die 502, 504. The second carrier 520 may be a glass carrier or another semiconductor wafer, for example.

FIG. 5C shows deactivating the first adhesive 518 in a region 524 corresponding to a location of the second group 508 of separated dies 504. In one embodiment, the first adhesive 518 is deactivated in the targeted regions 524 by selective UV (ultraviolet) exposure in the region of the source terminal S2 of the second group 508 of separated dies 504 while masking the source terminal S1 of the first group 506 of separated dies 502 to limit UV exposure to the targeted second die regions 524.

FIG. 5D shows deactivating the second adhesive 522 in a region 526 corresponding to a location of the first group 506 of separated dies 502. In one embodiment, the second adhesive 522 is deactivated in the targeted regions 526 by selective UV exposure in the region of the drain terminal D1 of the first group 506 of separated dies 502 while masking the drain terminal D2 of the second group 508 of separated dies 504 to limit UV exposure to the targeted first die regions 526.

FIG. 5E shows after the deactivating, separating the first carrier 516 with the first group 506 of separated dies 502 from the second carrier 520 with the second group 508 of separated dies 504 such that the backside 512 of the first group 506 of separated dies 502 is no longer attached to the second carrier 520 and the frontside 510 of the second group 508 of separated dies 504 is no longer attached to the first carrier 516.

FIG. 5F shows the second carrier 520 with the second group 508 of separated dies 504 attached thereto isolated from the first carrier 516 and the first group 506 of separated dies 502.

FIG. 5G shows, after the separating, attaching a third carrier 528 to the frontside 510 of the second group 508 of separated dies 504 which are attached to the second carrier 520 at the backside 512. The third carrier 528 may be a glass carrier or another semiconductor wafer, e.g., and may be the second group 508 of separated dies 504 may be attached to the third carrier 528 via a third adhesive 530.

FIG. 5H shows after attaching the third carrier 528, removing the second carrier 520 from the backside 512 of the second group 508 of separated dies 504. In one embodiment, the second adhesive 522 is deactivated by UV exposure to remove the second carrier 520.

FIG. 5I shows the wafer structure after flipping the third carrier 528 such that the backside 512 of the second group 508 of separated dies 504 faces a same direction as the frontside 510 of the first group 506 of separated dies 502. The first group 506 of separated dies 502 is not shown in FIG. 5I.

FIG. 5J shows attaching the backside 512 of the first group 506 of separated dies 502 to the third carrier 528. At this point in the wafer-level processing, the orientation of the second group 508 of separated dies 504 is reversed such that the second group 508 of separated dies 504 have an opposite orientation as the first group 506 of separated dies 502. In the case of power transistors, this may mean that the drain terminal D2 of the second group 508 of separated dies 504 faces the same direction as the source terminal S1 of the first group 506 of separated dies 502 and the source terminal S2 of the second group 508 of separated dies 504 faces the same direction as the drain terminal D1 of the first group 506 of separated dies 502.

FIG. 5K shows removing the first carrier 516 from the frontside 510 of the first group 506 of separated dies 502 and from the backside 512 of the second group 508 of separated dies 504. In one embodiment, the adhesive 518 attaching the first carrier 516 to the dies 502, 504 is deactivated by UV exposure to remove the first carrier 516.

FIG. 5L shows, as part of the wafer-level processing, securing the separated dies 502, 504 of the first and second groups 506, 508 to one another with a dielectric material 532. In one embodiment, the separated dies 502, 504 of the first and second groups 506, 508 are secured to one another with the dielectric material 532 by covering the first group 506 of separated dies 502 and the second group 508 of separated dies 504 with a dielectric material 532 and forming openings 534 in the dielectric material 532 that expose bond pads S1 at the frontside 510 of the separated dies 502 of the first group 506 and bond pads D2 at the backside 512 of the separated dies 504 of the second group 508. The dielectric material 532 may be photo-sensitive or non-photo-sensitive with photolithographic steps applied. For example, the dielectric material 532 may be an imide, an epoxy, BCB, etc. Photo-sensitive materials such as imide, epoxy, BCB, etc. enable processing of the dielectric material 532 as if it were photoresist. Accordingly, the separated dies 502, 504 may continue to be processed at the wafer level to build necessary circuitries such as interconnects, bond pads, etc.

For each multi-chip assembly being produced, a (lateral) spacing 536 between adjacent dies 502, 504 included in the multi-chip assembly may be less than 70 μm, e.g., in a range of 5 μm to 10 μm or even less. Spacing adjacent dies 502, 504 in each multi-chip assembly by less than 70 μm reduces stray inductance and thereby improving power efficiency. Wafer tooling has a very high alignment precision in the micron and even nanometer (nm) range, not the millimeter (mm) range like assembly tooling. For example, high throughput plasma dicing of a kerf width is in the range of about 5 um. A die spacing of less than 70 μm is significantly smaller than conventional power stage die spacing of around 100-150 um or greater, providing a much smaller stray inductance.

FIG. 5M shows, as part of the wafer-level processing, electrically interconnecting groups 538 of two or more adjacent ones of the separated dies 502, 504 from the first and second groups 506, 508. In one embodiment, groups 538 of two or more adjacent ones of the separated dies 502, 504 from the first and second groups 506, 508 are electrically connected by depositing a metal or metal alloy 540 such as Cu, AlCu, AlSiCu, Al, etc. over the dielectric material 532 and in the openings 534 and patterning the metal or metal alloy 540.

FIG. 5N shows, as part of the wafer-level processing, removing the dielectric material 532 in a region 542 between the groups 538 of electrically interconnected dies 502, 504 to laterally separate the groups 538 of electrically interconnected dies 502, 504 from one another. The dielectric material 532 may be removed in the region 542 between the groups 538 of electrically interconnected dies 502, 504 by etching, for example. Individual chipsets/chiplets may be molded later after all wafer-level processing is complete and the groups 538 of electrically interconnected dies 502, 504 are removed from the third carrier 528. Individual chipsets/chiplets may be packaged later. Additional passivation (not shown in FIG. 5N) may be provided on the top and bottom sides of individual chipsets/chiplets to protect the metallization 132, 540.

FIGS. 6A through 6H illustrate another embodiment of a method of producing multi-chip assemblies where one group of dies is replaced with dies from another wafer.

Figure 6A:
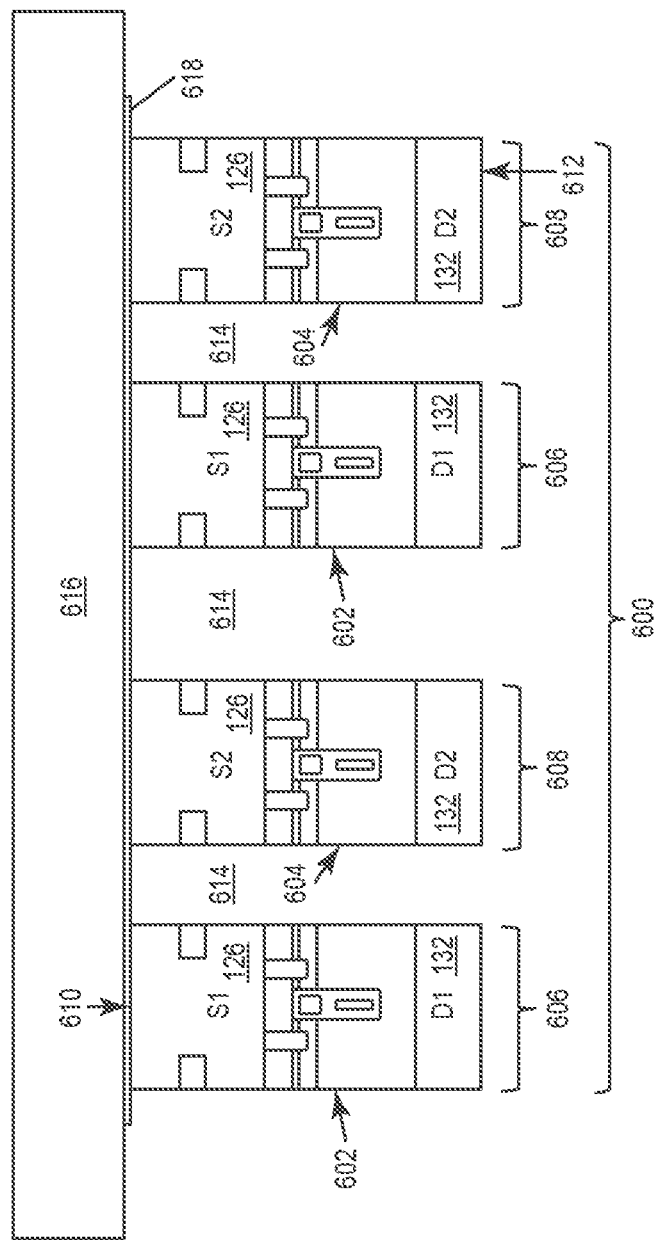
FIGS. 6A through 6H illustrate another embodiment of a method of producing multi-chip assemblies where one group of dies is replaced with dies from another wafer.

FIG. 6A shows processing of a semiconductor wafer 600 into separated dies 602, 604. The separated dies 602, 604 include a first group 606 of separated dies 602 and a second group 608 of separated dies 604. The separated dies 602, 604 may be power transistor dies, for example. Accordingly, each die 602, 604 may have a source terminal S1/S2 at a frontside 610 of the semiconductor wafer 600 and a drain terminal D1/D2 at a backside 612 of the semiconductor wafer 600. The power transistor dies 602 of the first group 606 and the power transistor dies 604 of the second group 608 may have the same or different transistor cell configuration and the power transistor dies 604 of the second group 608 may have a different shape and/or a different size than the power transistor dies 602 of the first group 606.

In one embodiment, the semiconductor wafer 600 is processed into the separated dies 602, 604 by laser or plasma etching trenches 614 into the frontside 610 of the semiconductor wafer 600 and thinning the semiconductor wafer 600 at the backside 612 of the wafer 600, e.g., by grinding. The trenches 614 may be etched to yield the desired shape for the power transistor dies 602 of the first group 606 and the power transistor dies 604 of the second group 608. After the trench etching and wafer thinning, a metallization layer 132 is deposited on the thinned backside 612 of the semiconductor wafer 600, e.g., to form the drain D1/D2 terminal of the dies 602, 604. A first carrier 616 may be attached, via a first adhesive 618, to the frontside 610 of each die 602, 604 to provide mechanical stability during the wafer thinning and metal deposition processed. The first carrier 616 may be a glass carrier or another semiconductor wafer, for example.

FIGS. 6B through 6E show replacing, via wafer-level processing, the second group 608 of separated dies 604 with a third group of separated dies. For example, the first and second groups 606, 608 of separated dies 602, 604 may be power transistor dies of the same type and the second group 608 of separated dies 604 may be replaced with power diode dies to be electrically connected anti-parallel with the power transistor dies or with controller or driver dies for the power transistors dies. Still other types of die replacements may be made.

Figure 6B:
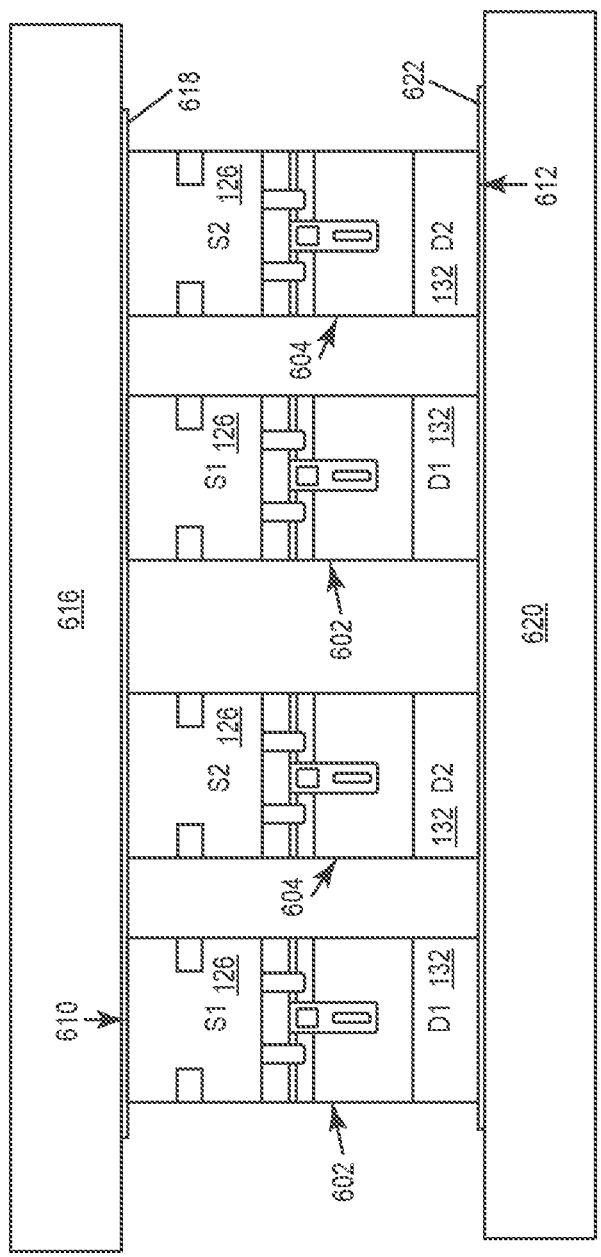

FIG. 6B shows a second carrier 620 attached, via a second adhesive 622, to the backside side 612 of each separated die 602, 604. The second carrier 620 may be a glass carrier or another semiconductor wafer, for example.

Figure 6C:
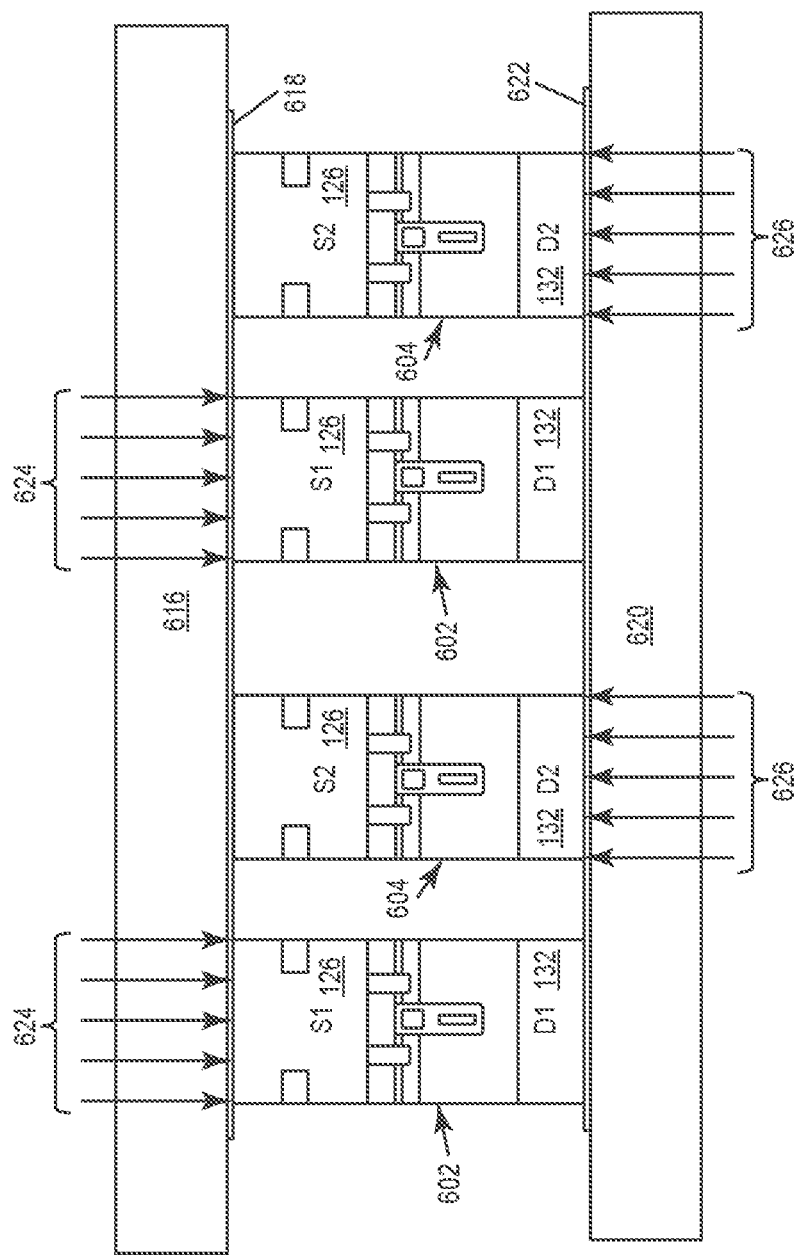

FIG. 6C shows deactivating the first adhesive 618 in a region 624 corresponding to a location of the first group 606 of separated dies 602 and deactivating the second adhesive 622 in a region 626 corresponding to a location of the second group 608 of separated dies 604. In one embodiment, the first adhesive 618 is deactivated in the first targeted regions 624 and the second adhesive 622 is deactivated in the second targeted regions 626 by selective UV exposure.

Figure 6D:
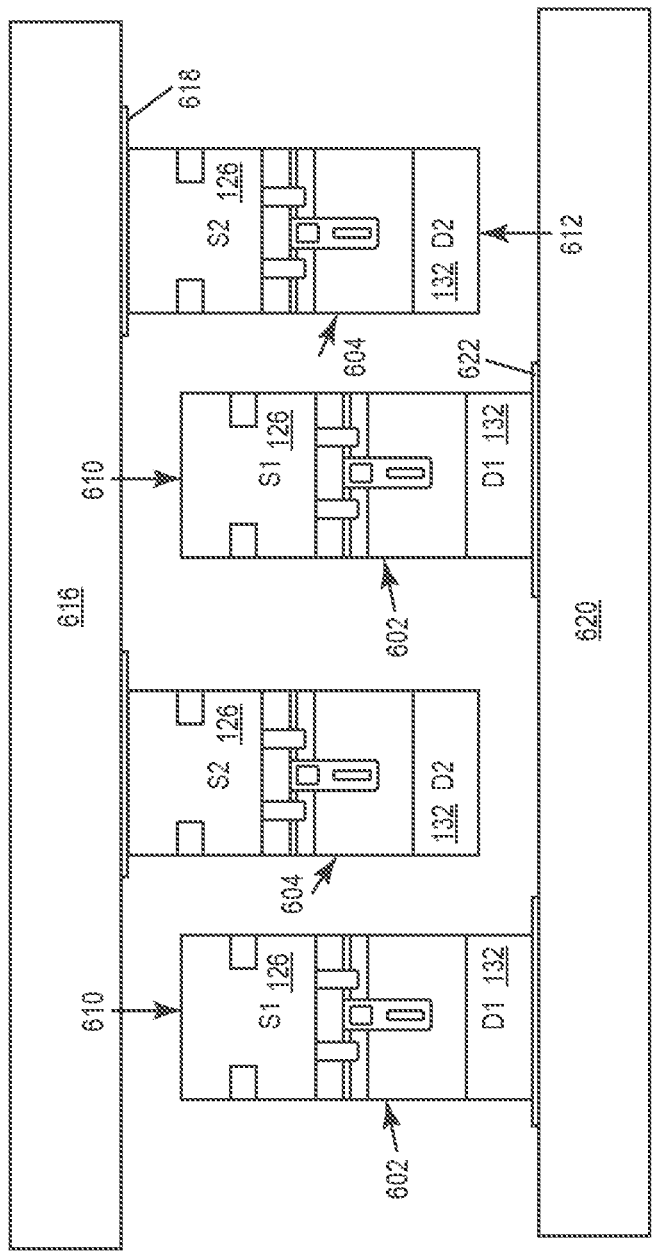

FIG. 6D shows after the deactivating, separating the first carrier 616 with the second group 608 of separated dies 604 from the second carrier 620 with the first group 606 of separated dies 602 such that the backside 612 of the second group 608 of separated dies 604 is no longer attached to the second carrier 620 and the frontside 610 of the first group 606 of separated dies 602 is no longer attached to the first carrier 616.

Figure 6E:
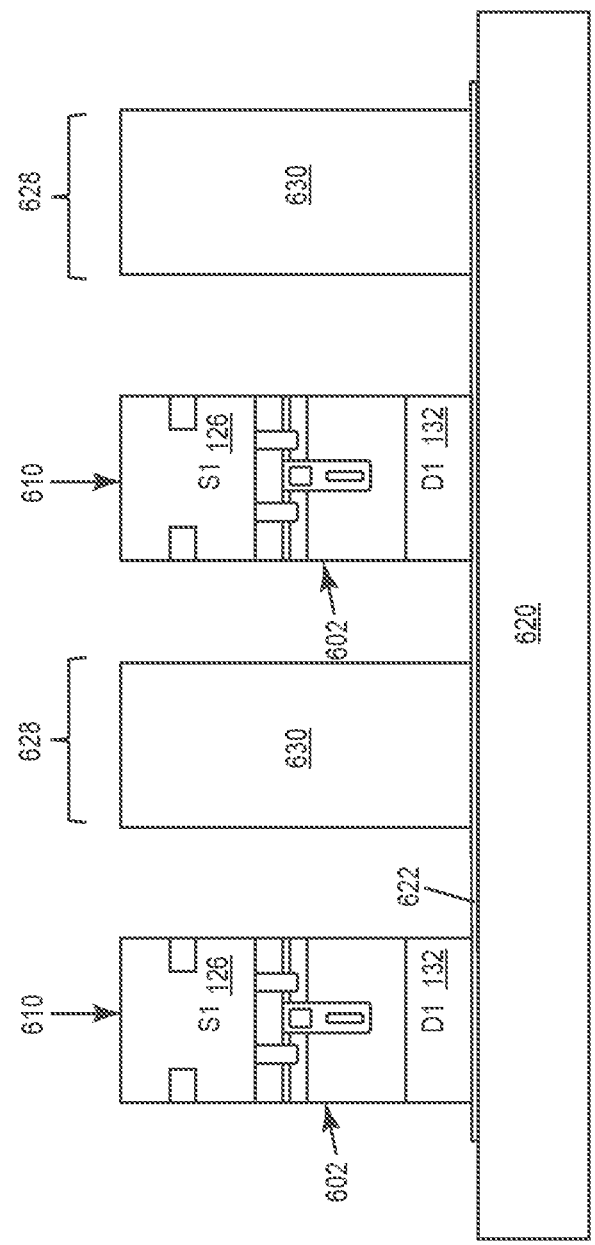

FIG. 6E shows, as part of the wafer-level processing, attaching a third group 628 of separated dies 630 to the second carrier 620 in the location previously occupied by the second group 608 of separated dies 604. As explained above, the separated dies 630 included in the third group 628 may be a different type of devices than the separated dies 502 included in the first group 606.

Figure 6F:
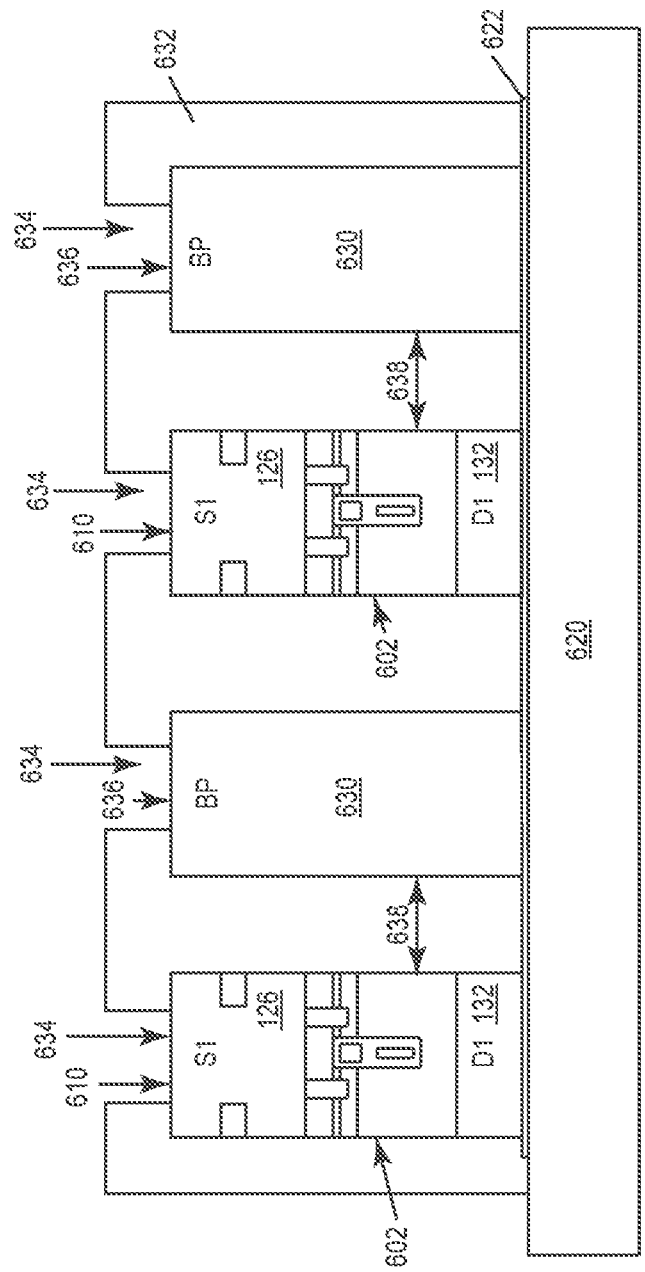

FIG. 6F shows, as part of the wafer-level processing, securing the separated dies 602, 630 of the first and third groups 606, 628 to one another with a dielectric material 632. In one embodiment, the separated dies 602, 630 of the first and third groups 606, 628 are secured to one another with the dielectric material 632 by covering the first group 606 of separated dies 602 and the third group 628 of separated dies 630 with a dielectric material 632 and forming openings 634 in the dielectric material 632 that expose bond pads S1 at the frontside 610 of the separated dies 602 of the first group 606 and bond pads BP at the backside 636 of the separated dies 630 of the third group 628. The dielectric material 632 may be photo-sensitive or non-photo-sensitive with photolithographic steps applied. For example, the dielectric material 632 may be an imide, an epoxy, BCB, etc. Accordingly, the separated dies 602, 630 may continue to be processed at the wafer level to build necessary circuitries such as interconnects, bond pads, etc.

For each multi-chip assembly being produced, a (lateral) spacing 638 between adjacent dies 602, 630 included in the multi-chip assembly may be less than 70 µm, e.g., in a range of 5 µm to 10 µm or even less, to reduce stray inductance and thereby improve power efficiency.

Figure 6G:
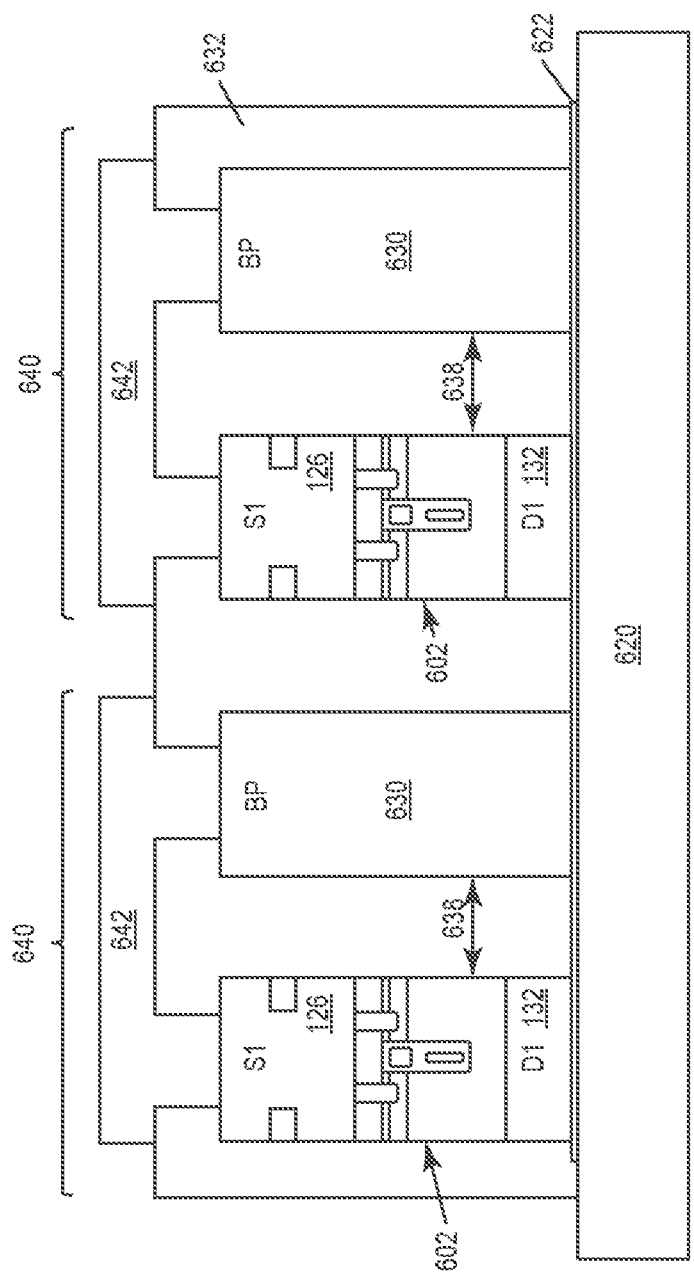

FIG. 6G shows, as part of the wafer-level processing, electrically interconnecting groups 640 of two or more adjacent ones of the separated dies 602, 630 from the first and third groups 606, 628. In one embodiment, groups 640 of two or more adjacent ones of the separated dies 602, 630 from the first and third groups 606, 628 are electrically connected by depositing a metal or metal alloy 642 such as Cu, AlCu, AlSiCu, Al, etc. over the dielectric material 632 and in the openings 634 and patterning the metal or metal alloy 642.

Figure 6H:
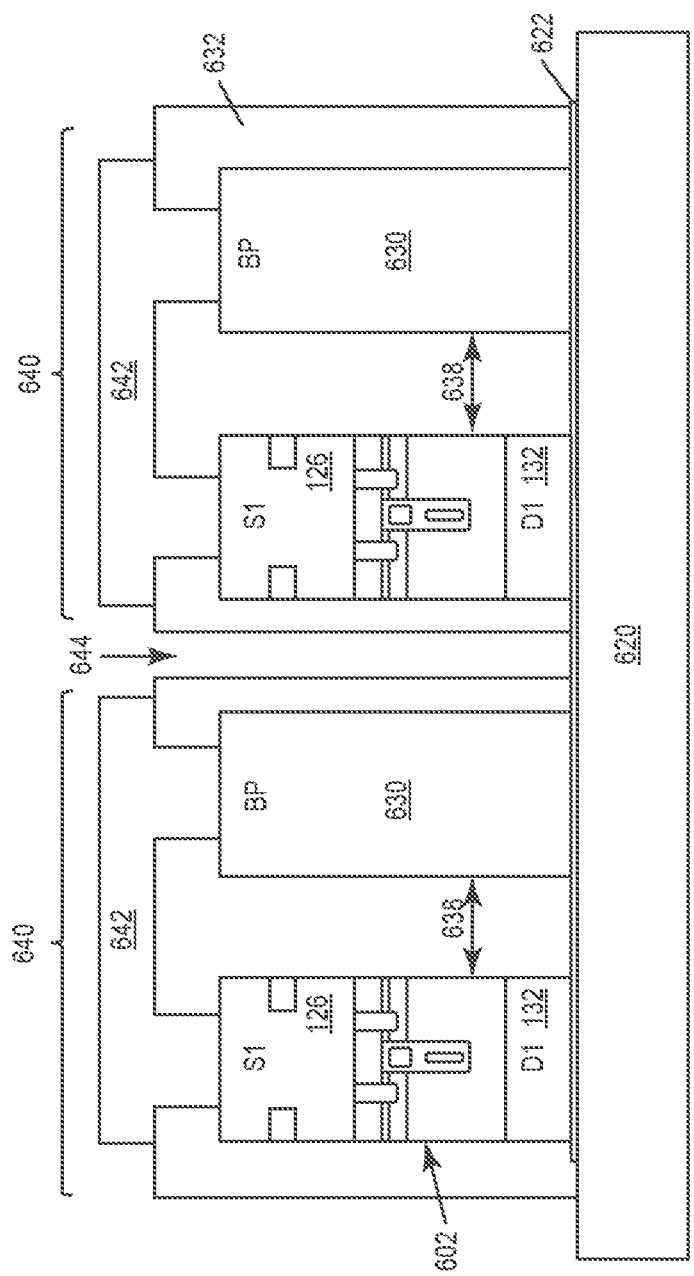

FIG. 6H shows, as part of the wafer-level processing, removing the dielectric material 632 in a region 644 between the groups 640 of electrically interconnected dies 602, 630 to laterally separate the groups 540 of electrically interconnected dies 602, 630 from one another. The dielectric material 632 may be removed in the region 644 between the groups 540 of electrically interconnected dies 602, 630 by etching, for example. Individual chipsets/chiplets may be molded later after all wafer-level processing is complete and the groups 640 of electrically interconnected dies 602, 630 are removed from the second carrier 620. Individual chipsets/chiplets may be packaged later. Additional passivation (not shown in FIG. 6H) may be provided on the top and bottom sides of individual chipsets/chiplets to protect the metallization 132, 642.

Although the present disclosure is not so limited, the following numbered examples demonstrate one or more aspects of the disclosure.

Example 1. A method of producing multi-chip assemblies, the method comprising: processing a semiconductor wafer into a plurality of separated dies, the plurality of separated dies including a first group of separated dies and a second group of separated dies; and via wafer-level processing: reversing an orientation of the second group of separated dies such that the second group of separated dies have an opposite orientation as the first group of separated dies; securing the separated dies of the first group and the second group to one another with a dielectric material; electrically interconnecting groups of two or more adjacent ones of the separated dies from the first group and the second group; and removing the dielectric material in a region between the groups of electrically interconnected dies to laterally separate the groups of electrically interconnected dies from one another.

Example 2. The method of example 1, wherein as part of processing the semiconductor wafer, a first carrier is attached, via a first adhesive, to a first side of both the first group and the second group of separated dies, and wherein reversing the orientation of the second group of separated dies comprises: attaching, via a second adhesive, a second carrier to a second side of both the first group and the second group of separated dies; deactivating the first adhesive in a region corresponding to a location of the second group of separated dies, and the second adhesive in a region corresponding to a location of the first group of separated dies; after the deactivating, separating the first carrier with the first group of separated dies from the second carrier with the second group of separated dies such that the second side of the first group of separated dies is no longer attached to the second carrier and the first side of the second group of separated dies is no longer attached to the first carrier; after the separating, attaching a third carrier to the first side of the second group of separated dies which are attached to the second carrier at the second side; after attaching the third carrier, removing the second carrier from the second side of the second group of separated dies; flipping the third carrier such that the second side of the second group of separated dies faces a same direction as the first side of the first group of separated dies; and attaching the second side of the second group of separated dies to the first carrier and the second side of the first group of separated dies to the third carrier.

Example 3. The method of example 2, wherein securing the separated dies of the first group and the second group to one another with the dielectric material comprises: removing the first carrier from the first side of the first group of separated dies and from the second side of the second group of separated dies; and after removing the first carrier, covering the first group of separated dies and the second group of separated dies with the dielectric material.

Example 4. The method of example 3, wherein electrically interconnecting groups of two or more adjacent ones of the separated dies from the first group and the second group comprises: forming openings in the dielectric material that expose bond pads at the first side of the separated dies of the first group and at the second side of the separated dies of the second group; depositing a metal or metal alloy over the dielectric material and in the openings; and patterning the metal or metal alloy.

Example 5. The method of example 3 or 4, wherein the dielectric material is an imide, an epoxy or BCB (benzocyclobutene).

Example 6. The method of any of examples 1 through 5, wherein processing the semiconductor wafer into the plurality of separated dies comprises: laser or plasma etching trenches into a frontside of the semiconductor wafer; thinning the semiconductor wafer at a backside of the semiconductor wafer; and depositing a metallization layer on the thinned backside of the semiconductor wafer.

Example 7. The method of any of examples 1 through 6, wherein for each multi-chip assembly, a spacing between adjacent dies included in the multi-chip assembly is less than 70 μm.

Example 8. The method of example 7, wherein for each multi-chip assembly, the spacing between adjacent dies included in the multi-chip assembly is in a range of 5 μm to 10 μm.

Example 9. The method of any of examples 1 through 8, wherein the plurality of separated dies are power transistor dies, wherein each multi-chip assembly includes one power transistor die from the first group and one power transistor die from the second group, and wherein for each multi-chip assembly, a source terminal of the power transistor die from the first group is electrically connected to a drain terminal of the power transistor die from the second group.

Example 10. The method of example 9, wherein the power transistor dies of the first group and the power transistor dies of the second group have the same transistor cell configuration and the power transistor dies of the second group have a different shape and/or a different size than the power transistor dies of the first group.

Example 11. The method of example 9 or 10, wherein the power transistor dies of the first group and the power transistor dies of the second group each have a simple polygon shape with more than four straight line segments.

Example 12. The method of example 9 or 10, wherein the power transistor dies of the first group each have a simple polygon shape with four straight line segments, wherein the power transistor dies of the second group each have a polygon shape with four straight line segments and a hole, and wherein the hole in the power transistor dies of the second group is sized to receive one of the power transistor dies of the first group.

Example 13. A method of producing multi-chip assemblies, the method comprising: processing a semiconductor wafer into a plurality of separated dies, the plurality of separated dies including a first group of separated dies and a second group of separated dies; and via wafer-level processing: replacing the second group of separated dies with a third group of separated dies; securing the separated dies of the first group and the third group to one another with a dielectric material; electrically interconnecting groups of two or more adjacent ones of the separated dies from the first group and the third group; and removing the dielectric material in a region between the groups of electrically interconnected dies to laterally separate the groups of electrically interconnected dies from one another.

Example 14. The method of example 13, wherein replacing the second group of separated dies with the third group of separated dies comprises: attaching the first group of separated dies and the second group of separated dies to a carrier via an adhesive; deactivating the adhesive in a region corresponding to a location of the second group of separated dies; after the deactivating, removing the second group of separated dies from the carrier; and after the removing, attaching the third group of separated dies to the carrier in the location previously occupied by the second group of separated dies.

Example 15. The method of example 13 or 14, wherein securing the separated dies of the first group and the third group to one another with the dielectric material comprises: covering the first group of separated dies and the third group of separated dies with the dielectric material.

Example 16. The method of example 15, wherein electrically interconnecting groups of two or more adjacent ones of the separated dies from the first group and the third group comprises: forming openings in the dielectric material that expose bond pads of the separated dies of the first group and the third group; depositing a metal or metal alloy over the dielectric material and in the openings; and patterning the metal or metal alloy.

Example 17. The method of example 15 or 16, wherein the dielectric material is an imide, an epoxy or BCB (benzocyclobutene).

Example 18. The method of any of examples 13 through 17, wherein processing the semiconductor wafer into the plurality of separated dies comprises: laser or plasma etching trenches into a frontside of the semiconductor wafer; thinning the semiconductor wafer at a backside of the semiconductor wafer; and depositing a metallization layer on the thinned backside of the semiconductor wafer.

Example 19. The method of any of examples 13 through 18, wherein for each multi-chip assembly, a spacing between adjacent dies included in the multi-chip assembly is less than 70 μm.

Example 20. The method of example 19, wherein for each multi-chip assembly, the spacing between adjacent dies included in the multi-chip assembly is in a range of 5 μm to 10 μm.

Example 21. A multi-chip assembly, comprising: a first power transistor die having a source terminal facing a first direction, and a drain terminal facing a second direction opposite the first direction; a second power transistor die having a drain terminal facing the first direction, and a source terminal facing the second direction; a dielectric material occupying a gap between the first power transistor die and the second power transistor die, and securing the first power transistor die and the second power transistor die to one another; and a metallization connecting the source terminal of the first power transistor die to the drain terminal of the second power transistor die at a same side of the multi-chip assembly, wherein the gap occupied by the dielectric material is less than 70 μm.

Example 22. The multi-chip assembly of example 21, wherein the gap occupied by the dielectric material is in a range of 5 μm to 10 μm.

Example 23. The multi-chip assembly of example 21 or 22, wherein the dielectric material is an imide, an epoxy or BCB (benzocyclobutene).

Example 24. The multi-chip assembly of any of examples 21 through 23, wherein the first power transistor die and the second power transistor die each have a simple polygon shape with more than four straight line segments.

Example 25. The multi-chip assembly of any of examples 21 through 23, wherein the first power transistor die has a simple polygon shape with four straight line segments, wherein the second power transistor die has a polygon shape with four straight line segments and a hole, and wherein the first power transistor die is disposed in the hole in the second power transistor die.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of producing multi-chip assemblies, the method comprising:
   processing a semiconductor wafer into a plurality of separated dies, the plurality of separated dies including a first group of separated dies and a second group of separated dies; and
   via wafer-level processing:
   reversing an orientation of the second group of separated dies such that the second group of separated dies have an opposite orientation as the first group of separated dies;
   securing the separated dies of the first group and the second group to one another with a dielectric material;
   electrically interconnecting groups of two or more adjacent ones of the separated dies from the first group and the second group; and
   removing the dielectric material in a region between the groups of electrically interconnected dies to laterally separate the groups of electrically interconnected dies from one another.

2. The method of claim 1, wherein as part of processing the semiconductor wafer, a first carrier is attached, via a first adhesive, to a first side of both the first group and the second group of separated dies, and wherein reversing the orientation of the second group of separated dies comprises:
   attaching, via a second adhesive, a second carrier to a second side of both the first group and the second group of separated dies;
   deactivating the first adhesive in a region corresponding to a location of the second group of separated dies, and the second adhesive in a region corresponding to a location of the first group of separated dies;
   after the deactivating, separating the first carrier with the first group of separated dies from the second carrier with the second group of separated dies such that the second side of the first group of separated dies is no longer attached to the second carrier and the first side of the second group of separated dies is no longer attached to the first carrier;
   after the separating, attaching a third carrier to the first side of the second group of separated dies which are attached to the second carrier at the second side;
   after attaching the third carrier, removing the second carrier from the second side of the second group of separated dies;
   flipping the third carrier such that the second side of the second group of separated dies faces a same direction as the first side of the first group of separated dies; and
   attaching the second side of the second group of separated dies to the first carrier and the second side of the first group of separated dies to the third carrier.

3. The method of claim 2, wherein securing the separated dies of the first group and the second group to one another with the dielectric material comprises:
   removing the first carrier from the first side of the first group of separated dies and from the second side of the second group of separated dies; and
   after removing the first carrier, covering the first group of separated dies and the second group of separated dies with the dielectric material.

4. The method of claim 3, wherein electrically interconnecting groups of two or more adjacent ones of the separated dies from the first group and the second group comprises:
   forming openings in the dielectric material that expose bond pads at the first side of the separated dies of the first group and at the second side of the separated dies of the second group;
   depositing a metal or metal alloy over the dielectric material and in the openings; and
   patterning the metal or metal alloy.

5. The method of claim 3, wherein the dielectric material is an imide, an epoxy or BCB (benzocyclobutene).

6. The method of claim 1, wherein processing the semiconductor wafer into the plurality of separated dies comprises:
   laser or plasma etching trenches into a frontside of the semiconductor wafer;
   thinning the semiconductor wafer at a backside of the semiconductor wafer; and
   depositing a metallization layer on the thinned backside of the semiconductor wafer.

7. The method of claim 1, wherein for each multi-chip assembly, a spacing between adjacent dies included in the multi-chip assembly is less than 70 µm.

8. The method of claim 7, wherein for each multi-chip assembly, the spacing between adjacent dies included in the multi-chip assembly is in a range of 5 µm to 10 µm.

9. The method of claim 1, wherein the plurality of separated dies are power transistor dies, wherein each multi-chip assembly includes one power transistor die from the first group and one power transistor die from the second group, and wherein for each multi-chip assembly, a source terminal of the power transistor die from the first group is electrically connected to a drain terminal of the power transistor die from the second group.

10. The method of claim 9, wherein the power transistor dies of the first group and the power transistor dies of the second group have the same transistor cell configuration and the power transistor dies of the second group have a different shape and/or a different size than the power transistor dies of the first group.

11. The method of claim 9, wherein the power transistor dies of the first group and the power transistor dies of the second group each have a simple polygon shape with more than four straight line segments.

12. The method of claim 9, wherein the power transistor dies of the first group each have a simple polygon shape with four straight line segments, wherein the power transistor dies of the second group each have a polygon shape with four straight line segments and a hole, and wherein the hole in the power transistor dies of the second group is sized to receive one of the power transistor dies of the first group.

\* \* \* \* \*